United States Patent
Nakai et al.

(10) Patent No.: US 6,795,362 B2
(45) Date of Patent: Sep. 21, 2004

(54) POWER CONTROLLING METHOD FOR SEMICONDUCTOR STORAGE DEVICE AND SEMICONDUCTOR STORAGE DEVICE EMPLOYING SAME

(75) Inventors: Kiyoshi Nakai, Tokyo (JP); Yutaka Ito, Tokyo (JP); Takeshi Hashimoto, Tokyo (JP); Hideaki Kato, Tokyo (JP)

(73) Assignees: Elpida Memory, Inc., Tokyo (JP); Hitachi ULSI Systems Co., Ltd., Tokyo (JP); Hitachi Ltd., Tokyo (JP)

( * ) Notice: Subject to any disclaimer, the term of this patent is extended or adjusted under 35 U.S.C. 154(b) by 17 days.

(21) Appl. No.: 10/227,950

(22) Filed: Aug. 27, 2002

(65) Prior Publication Data

US 2003/0061536 A1 Mar. 27, 2003

(30) Foreign Application Priority Data

Aug. 27, 2001 (JP) ........................................ 2001-256913

(51) Int. Cl.[7] ................................................. G11C 7/00
(52) U.S. Cl. ........................ 365/222; 365/227; 365/228; 365/229
(58) Field of Search ................................. 365/222, 227, 365/228, 229

(56) References Cited

U.S. PATENT DOCUMENTS

| | | | | |
|---|---|---|---|---|
| 6,414,894 B2 | * | 7/2002 | Ooishi et al. | 365/222 |
| 6,426,908 B1 | * | 7/2002 | Hidaka | 365/222 |
| 6,512,715 B2 | * | 1/2003 | Okamoto et al. | 365/227 |

* cited by examiner

Primary Examiner—Tan T. Nguyen
(74) Attorney, Agent, or Firm—Young & Thompson

(57) ABSTRACT

A method for controlling power for a semiconductor storage device and the semiconductor storage device are provided which enable power consumption to be greatly reduced in a standby state. The power control method uses an ultra-low power consumption mode in which power control can be exerted in the standby state. In the ultra-low power consumption mode, a burst self-refresh state, power-OFF state, and power-ON state are provided. In the burst self-refresh state, memory cells are refreshed in a centralized manner. In the power-OFF state, an internal power source circuit can be partially turned OFF. In the power-ON state, internal power sources having been partially turned OFF are turned ON. Therefore, it is possible to greatly reduce power consumption in the standby state.

47 Claims, 13 Drawing Sheets

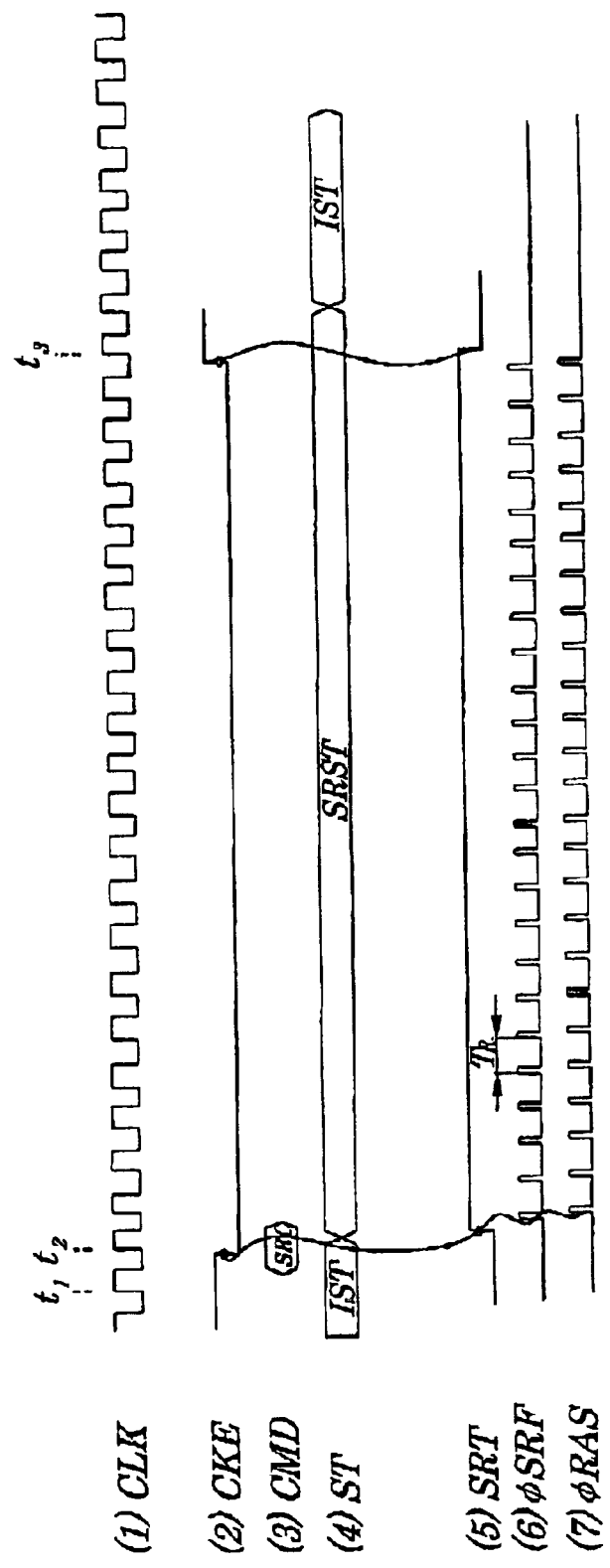

POWER CONTROLLING METHOD FOR SEMICONDUCTOR STORAGE DEVICE AND SEMICONDUCTOR STORAGE DEVICE EMPLOYING SAME

BACKGROUND OF THE INVENTION

1. Field of the Invention

The present invention relates to a method for controlling power for a semiconductor storage device having a memory cell which must be refreshed to maintain data and the semiconductor storage device employing the method for controlling power.

The present application claims priority of Japanese Patent Application No. 2001-256913 filed on Aug. 27, 2001, which is hereby incorporated by reference.

2. Description of the Related Art

FIG. 13 is a block diagram showing an example of configurations of a conventional semiconductor storage device having a memory cell which must be refreshed to maintain data. The conventional semiconductor storage device is a DRAM (Dynamic Random Access Memory) having a storage capacity of 64 Mbits and is made up of four banks and having a number of refresh processes denoting a number of rows in each of memory cell arrays $11_1$ to $11_4$ activated by one time refresh process being 4096 ($=2^{12}$). The conventional semiconductor storage device chiefly includes four pieces of banks $1_1$ to $1_4$, column decoder groups $2_1$ to $2_4$, row decoder groups $3_1$ to $3_4$, an input buffer 4, an output buffer 5, a multiplexer (MUX) 6, a command decoder 7, a row column address buffer 8, a refresh counter 9, and a self-refresh circuit 10.

Each of the banks $1_1$ to $1_4$ includes each of the memory cell arrays $11_1$ to $11_4$ and each of sense amplifiers/input and output buses (SA-IOB) $12_1$ to $12_4$. Each of the memory cell arrays $11_1$ to $11_4$ has a storage capacity of 16 Mbits in which a plurality of pieces of memory cells is arranged in a matrix form. Each of sense amplifiers (SAs) making up each of the SA-IOB $12_1$ to $12_4$ detects data read from a memory cell on a column of corresponding memory cell arrays $11_1$ to $11_4$ being selected by a row decoder making up the corresponding row decoder groups $3_1$ to $3_4$ to a bit line and amplifies the detected data. Each of the input/output buses (IOBs) making up each of the SA-IOBs $12_1$ to $12_4$, while being connected to a global input/output bus 13, at a time of reading data, transmits data detected and amplified by each of the corresponding SAs to the global input/output bus 13 while, at a time of writing data, transmits the data transmitted by the global input/output bus 13 to a memory cell selected out of the corresponding memory cell arrays $11_1$ to $11_4$.

Each of the column decoder groups $2_1$ to $2_4$ is mounted on each of the banks $1_1$ to $1_4$ and has a plurality of column decoders. Each of the column decoders operates to decode a column address fed from a row column address buffer 8 and outputs a plurality of column selection switching signals used to put each of the SAs being connected to corresponding bit lines of each of memory cell arrays $11_1$ to $11_4$ into a selection state. Each of the row decoder groups $3_1$ to $3_4$ is mounted on each of the banks $1_1$ to $1_4$ and has a plurality of row decoders. Each of the row decoders decodes a row address fed from the row column address buffer 8 and puts a corresponding word line of each of the memory cell arrays $11_1$ to $11_4$ into the selection state.

The input buffer 4 being connected commonly to the banks $1_1$ to $1_4$ amplifies and buffers data being input a data input/output terminal DQ and then feeds it to the MUX 6. The output buffer 5 being connected commonly to the banks $1_1$ to $1_4$ amplifies and buffers data fed from the MUX 6 and outputs sequentially it from the data input/output terminal DQ. The MUX 6 feeds data supplied through the global input and output bus 13 from the IOBs making up the SA-IOB $12_1$ to $12_4$ to the output buffer 5 and data fed from the input buffer 4 through the global input/output bus 13 to the IOBs making up SA-IOB $12_1$ to $12_4$.

The command decoder 7, when a clock enable signal CKE fed from an external is changed from its high to low level, decodes a chip select signal/Cs, row address strobe signal/RAS, column address strobe signal/CAS, and write enable signal/WE fed in synchronization with a clock CLK fed from an external and, if it is judged that operations are in a self-refresh mode (entry), produces a high-level self-refresh start signal SRT and feeds the row column address buffer 8 and the self-refresh circuit 10. The self-refresh start signal SRT is used to instruct a self-refresh process to be started. Also, the command decoder 7 produces a row activated signal φ RAS based on a self-refresh signal φ SRF supplied from the self-refresh circuit 10 and feeds it to a row column address buffer 8. The self-refresh signal φ SRF is an original signal from which the row activated signal φ RAS is produced and is used to set a basic period for the self-refresh process. The row activated signal φ RAS is a basic signal used to activate row-based components such as the row decoder groups $3_1$ to $3_4$ or a like. Moreover, the clock enable signal CKE is active high while the chip select signal/CS, row address strobe signal/RAS, column address strobe signal/CAS, and write enable signal/WE are all active low.

The row column address buffer 8, while an ordinary operation is being performed, produces a column address and a row address based on an address AD fed from an external and the row address is fed to a plurality of row decoders making up each of the row decoder groups $3_1$ to $3_4$ with timing when a row activated signal φ RAS is fed from a command decoder 7. Also, the row column address buffer 8, when a self-refresh start signal SRT is fed from the command decoder 7 at a time of the self-refresh process, based on a counter value RCT supplied from the refresh counter 9, produces a row address for the self-refresh process and, with timing when a row activated signal φ RAS supplied from the command decoder 7 is fed, feeds the row address to the plurality of row decoders making up each of the row decoder groups $3_1$ to $3_4$. In the refresh counter 9, at the time of a self-refresh process, its counter value RCT is updated and the updated counter value RCT is fed to the row column address buffer 8. The self-refresh circuit 10, based on a high-level self-refresh start signal SRT supplied from the command decoder 7, produces a self-refresh signal φ SRF in a period of a clock produced by an oscillator (not shown) mounted therein and feeds it to the command decoder 7.

Next, internal operations of the semiconductor storage device having configurations described above to be performed at a time of the self-refresh process will be described by referring to a timing chart shown in FIG. 14. First, the clock enable signal CKE, as shown in FIG. 14 (2), remains high in an initial state before time $t_1$ and the clock CLK changes to be low in synchronization with a rise of a clock CLK at the time $t_2$ (see FIG. 14(1)). That is, in the initial state before the time $t_1$, an internal state ST of the conventional semiconductor storage device is an idle state IST in which no operation is performed, as shown in FIG. 14(4).

In such the initial state, the clock enable signal CKE (see FIG. 14(1)) changes to be low in synchronization with a rise of a clock CLK at the time $t_2$ as shown in FIG. 14(2) and, as shown in FIG. 14(3), a command SRC, one of a command CMD, used to instruct setting of a self-refresh mode is fed. The command SRC is fed when, for example, a low-level chip selector signal/CS, low-level row address strobe signal/RAS, low-level column address strobe signal/CAS and high-level write enable signal/WE are supplied in synchronization with the clock CLK. This makes the command decoder 7 decode the low-level chip select signal/CS, low-level row address strobe signal/RAS, low level column address strobe signal/CAS and high-level write enable signal/WE and judges that operations are set to be in a self-refresh mode. Therefore, the command decoder 7 produces a high-level self-refresh start signal SRT shown in FIG. 14(5) and feeds it to the self-refresh circuit 10.

This causes the internal state ST of the conventional semiconductor storage device to be changed from its idle state IST to its self-refresh state SRST, as shown in FIG. 14(4). That is, the self-refresh circuit 10, based on a high-level self-refresh start signal SRT fed from the command decoder 7, in a period of a clock produced by the oscillator mounted therein, produces a self-refresh signal φ SRF shown in FIG. 14(6) and feeds it to the command decoder 7. This causes the command decoder 7 to produce, based on a self-refresh signal φ SRF fed from the self-refresh circuit 10, a row activated signal φ RAS shown in FIG. 14(7) and feeds it to the row column address buffer 8. Therefore, the row column address buffer 8, when a self-refresh start signal SRT is fed from the command decoder 7, based on a counter value RCT supplied from the refresh counter 9, produces a row address to be used for the self-refresh process and feeds it to each of a plurality of row decoders making up each of the row decoder groups $3_1$ to $3_4$ with timing when a row activated signal φ RAS is fed from the command decoder 7. Thereafter, in the conventional semiconductor storage device, a refresh process is performed at equal intervals on all word lines (4096 cycles) in a period of a clock (hereinafter referred to be a refresh period $T_R$) produced by an oscillator mounted within the self-refresh circuit 10. Since the conventional semiconductor storage device is a DRAM (Dynamic Random Access Memory) having a number of refresh processes denoting a number of rows of a memory cell array activated by one time refresh process being 4096 ($=2^{12}$), so long as the refresh process is not performed, if time during which data is not lost (being referred to as a real refreshing capability $t_{REF}$) is 64 msec, the refresh period $T_R$ is set, in advance, to be 15.6 μsec (FIG. 14(6)). On the other hand, if the real refreshing capability $t_{REF}$ is 128 msec, the refresh period $T_R$ is set to be 31.2 μsec.

Next, to exit the self-refresh mode, for example, at the time $t_3$, as shown in FIG. 14(2), regardless of a rising edge of the clock CLK (see FIG. 14(1)) at the time $t_3$, a clock enable signal CKE is changed from its low to high level. This causes the command decoder 7 to change a self-refresh start signal SRT from its high to low level and feeds it to the self-refresh circuit 10. Therefore, the self-refresh circuit 10, based on a low-level self-refresh start signal SRT fed from the command decoder 7, as shown in FIG. 14(6), stops production of a self-refresh signal φ SRF. As a result, the command decoder 7, since a self-refresh signal φ SRF is not fed from the self-refresh circuit 10, as shown in FIG. 14(7), stops the production of a row activated signal φ RAS. By operations described above, the internal state ST of the conventional semiconductor storage device, as shown in FIG. 14(4), changes from its self-refresh state SRST to its idle state IST. Moreover, when the clock enable signal CKE is changed from its low to high level, if a refresh process is performed, after the refresh process has finished, the internal state ST of the conventional storage device changes from its self-refresh state SRST to its idle state IST.

In a self-refresh mode, in a standby state where a system such as a computer or a like, in which DRAMs are mounted, is not accessed from an external, data being stored in a memory cell is periodically and automatically held. Therefore, in the self-refresh mode, refresh processes are not directly related to operations of systems, it is thus desirous that power consumption is made as small as possible. In recent years in particular, portable electronic devices are widely used and, in the semiconductor storage device being mounted in portable electronic devices, more reduction in power consumption is required and a specification of current consumption becomes more rigorous (conventionally being specified to be about 1 mA. However, it is now about 100 μA ). Here, the portable electronic device includes notebook-type, palm-type, and pocket-type computers, or a like, a PDA (Personal Digital Assistance), portable cellular phone, PHS (Personal Handy-phone System), or a like.

Next, a reason why power consumption in the portable electronic device has to be reduced will be described. In portable electronic devices, power is supplied from a battery, a dry cell, or a like and a power source voltage of the portable electronic device is lower than that of a stationary type electronic device whose power is supplied from a commercial power source. Therefore, a power source voltage employed in the semiconductor storage device being mounted in portable electronic devices is made lower which, as a result, causes a threshold voltage of a transistor making up peripheral devices such as an input buffer 4 or output buffer 5 to be made lower. A leak current (sub-threshold leak current) occurring in a standby state in such the peripheral circuits tends to increase due to such lowering in the threshold voltage of the transistor making up the peripheral circuits.

Moreover, as described above, in the semiconductor storage device being mounted on portable electronic devices, due to rigorous specifications of current consumption, a current being consumed at a time of refreshing is reduced and, as a result, not only a minute leak current but also the sub-threshold leak current occurring due to defective processes in each of the memory cells may not be negligible. However, in the conventional semiconductor storage device, in its self-refresh mode, as described above, only a thing that is done therein is to perform a periodical refresh process at a refresh period $T_R$ having been set in advance according to the real refreshing capability $t_{REF}$ in the semiconductor storage device. Therefore, in the above conventional semiconductor device, a data maintaining current is determined by the real refreshing capability $t_{REF}$ and an alternating current cannot be reduced and rigorous specifications of current consumption are not met. Moreover, a direct current such as a leak current, minute leak current, or a like that tend to increase cannot be reduced.

SUMMARY OF THE INVENTION

In view of the above, it is an object of the present invention to provide a method for controlling power for a semiconductor storage device and the semiconductor storage device which enable power consumption to be greatly reduced in a standby state.

According to a first aspect of the present invention, there is provided a method for controlling power for a semiconductor storage device having a memory cell which must be refreshed to maintain data, including:

a step of employing an ultra-low power consumption mode in which power control is exerted in a standby state and in which a centralized refresh state, power-OFF state, and power-ON state are provided, and wherein the memory cell is refreshed in a centralized manner in the centralized refresh state, an internal power source circuit is partially turned OFF in the power-OFF state, and the internal power source circuit having been partially turned OFF is turned ON in the power-ON state.

In the foregoing, a preferable mode is one wherein, in the ultra-low power consumption mode, an error correcting circuit encode state and an error correcting circuit decode state are provided and wherein, in the error correcting circuit encode state, an arithmetic operation is performed on parity bits by the error correcting circuit to restore the memory cell whose maintaining (holding) characteristics are deteriorated and wherein, in the error correcting encode state, an error correction is made by the error correcting circuit based on results from the arithmetic operations.

Also, a preferable mode is one wherein the error correcting circuit operates in synchronization with a clock produced internally or fed from an external.

Also, a preferable mode is one wherein a state signal indicating that the semiconductor storage device is internally put in the ultra-low power consumption mode is output to an external.

Also, a preferable mode is one wherein the semiconductor storage device is configured to operate in a self-refresh mode such that the memory cell is periodically and automatically refreshed.

Also, a preferable mode is one wherein, in the centralized refresh state, the refresh process is performed on the memory cell in a period being shorter than that being corresponded to a maintaining characteristic of the memory cell.

Also, a preferable mode is one wherein, wherein, in the power-OFF state, all power sources other than paired poles in the internal power source circuit are turned OFF.

Also, a preferable mode is one wherein, in the power-OFF state, leak paths of peripheral circuits of a memory cell array made up of a plurality of the memory cells are interrupted.

Also, a preferable mode is one wherein transition to the centralized refresh state occurs when instructions for the semiconductor storage device to be put in the ultra-low power consumption mode are provided and then transition from the centralized refresh state to the power-OFF state, from the power-OFF state to the power-ON state, and from the power-ON state to the centralized state are repeated.

Also, a preferable mode is one wherein, in the ultra-low power consumption mode, if the semiconductor storage device is put in the centralized refresh state when instructions for exiting the ultra-low power consumption mode are provided, transition occurs to a self-refresh state in which the memory cell is refreshed in a period corresponding to a maintaining characteristic of the memory cell.

Also, a preferable mode is one wherein, in the ultra-low power consumption mode, if the semiconductor storage device is put in the power-OFF state when instructions for exiting the ultra-low power consumption mode are provided, transition occurs to a self-refresh state in which the memory cell is refreshed in a period corresponding to a maintaining characteristic of the memory cell.

Also, a preferable mode is one wherein, when instructions for the semiconductor storage device to be put in the ultra-low power consumption mode are provided, transition to the error correcting circuit encode state and to the centralized refresh state sequentially occur and, until instructions for exiting the ultra-low power consumption mode are provided, transition from the centralized refresh state to the power-OFF state, from the power-OFF state to the power-ON state, and from the power-ON state to the centralized refresh state are repeated.

Also, a preferable mode is one wherein, when instructions for the semiconductor storage device to be put in the ultra-low power consumption mode are provided, transition to the error correcting encode state, to the power-OFF state, and to the centralized refresh state sequentially occurs and, until instructions for exiting the ultra-low power consumption mode are provided, transition from the centralized refresh state to the power-OFF state, from the power-OFF state to the power-ON state, and from the power-ON state to the centralized refresh state are repeated.

Also, a preferable mode is one wherein, in the ultra-low power consumption mode, if the semiconductor storage device is put in the centralized refresh state when the ultra-low power consumption mode exits, transition to the error correcting circuit decode state occurs and then transition occurs to a self-refresh state in which the memory cell is refreshed in a period corresponding to a maintaining characteristic of the memory cell.

Also, a preferable mode is one wherein, in the ultra-low power consumption mode, if the semiconductor storage device is put in the power-OFF state when instructions for exiting the ultra-low power consumption mode are provided, transition to the power-ON state and to the error correcting circuit decode state sequentially occurs and then transition occurs to a self-refresh state in which the memory cell is refreshed in a period corresponding to a maintaining characteristic of the memory cell.

Also, a preferable mode is one wherein, in the ultra-low power consumption mode, if the semiconductor storage device is put in the error correcting circuit encode state when instructions for exiting the ultra-low power consumption mode are provided, after termination of the error correcting circuit encode state, transition occurs to a self-refresh state in which the memory cell is refreshed in a period corresponding to a maintaining characteristic of the memory cell.

Also, a preferable mode is one, wherein instructions are provided to put the semiconductor storage device into the ultra-low power consumption mode by a first change occurring in a specified signal fed from an external and to exit the ultra-low power consumption mode by a second change occurring in the specified signal.

Also, a preferable mode is one wherein, after instructions have been provided for exiting the ultra-low power consumption mode, instructions are provided for transition of an internal state of the semiconductor storage device to an idle state where no operation is performed again by the second change occurring in the specified signal.

Also, a preferable mode is one wherein, after having the specified signal produce the second change in order to give instructions for exiting the ultra-low power consumption mode, when maximum time or more required for error corrections in the error correcting circuit decode state has elapsed, the second change is produced in the specified signal used to give instructions for transition of an internal state of the semiconductor storage device to the idle state.

According to a second aspect of the present invention, there is provided a semiconductor storage device having a memory cell which must be refreshed to maintain data, including:

a self-refresh executing unit to refresh the memory cell;
an internal power source circuit to provide power to each of components; and a controller, when instructions are provided for operations in an ultra-low power consumption mode in order to exert power control in a standby state, to have the self-refresh executing unit execute refresh operations in a centralized refresh state in which a centralized refresh process is performed on the memory cell, in a power-OFF state in which the internal power source circuit is partially turned OFF, and in a power-ON state in which the internal power source circuit having been partially turned OFF is turned ON.

In the foregoing, a preferable mode is one that where includes an error correcting circuit used to perform arithmetic operations on parity bits to restore the memory cell whose maintaining characteristics are deteriorated and to make error corrections based on results from the arithmetic operations and wherein the controller executes operations in an error correcting circuit encode state to have the error correcting circuit perform the arithmetic operations and in an error correcting circuit decode state to have the error correcting circuit make the error correction.

Also, a preferable mode is one wherein the error correcting circuit operates in synchronization with a clock occurring internally or being fed from an external.

Also, a preferable mode is one wherein the controller outputs a state signal indicating that the semiconductor storage device is internally put in the ultra-low power consumption mode.

Also, a preferable mode is one wherein a self-refresh mode is used which is able to perform the refresh operations periodically and automatically.

Also, a preferable mode is one wherein the controller has, in the centralized refresh state, the refresh executing unit perform the refresh process in a period being shorter than that corresponding to a maintaining characteristic of the memory cell.

Also, a preferable mode is one wherein the controller, in the power-OFF state, turns OFF all power sources other than paired poles in the internal power source circuit.

Also, a preferable mode is one wherein the controller, in the power-OFF state, interrupts a leak path of peripheral circuits of a memory array made up of a plurality of the memory cells.

Also, a preferable mode is one wherein the controller, when instructions are provided for operations in the ultra-low power consumption mode, changes an internal state of the semiconductor storage device to the centralized refresh state and, until instructions for exiting the ultra-low power consumption mode are provided, repeats transition from the centralized refresh state to the power-OFF state, from the power-OFF state to the power-ON state, and from the power-ON state to the centralized refresh state.

Also, a preferable mode is one wherein the controller, in the ultra-low power consumption state, if the semiconductor storage device is put in the centralized refresh state when instructions for exiting the ultra-low power consumption state are provided, induces occurrence of transition of an internal state of the semiconductor storage device to a self-refresh state in which a refresh process is performed on the memory cell in a period corresponding to a maintaining characteristic of the memory cell.

Also, a preferable mode is one wherein the controller, in the ultra-low power consumption mode, if the semiconductor storage device is put in the power-OFF state when instructions for exiting the ultra-low power consumption mode are provided, changes an internal state of the semiconductor storage device to the power-ON state and then induces occurrence of transition to a self-refresh state in which a refresh process is performed on the memory cell in a period corresponding to a maintaining characteristic of the memory cell.

Also, a preferable mode is one wherein the controller, when instructions for operations in the ultra-low power consumption are provided, sequentially changes an internal state of the semiconductor storage device to the error correcting circuit encode state and to the centralized refresh state and, until instructions for exiting the ultra-low power consumption are provided, repeats transition from the centralized refresh state to the power-OFF state, from the power-OFF state to the power-ON state, and from the power-ON state to the centralized refresh state.

Also, a preferable mode is one wherein the controller, when instructions for operations in the ultra-low power consumption are provided, sequentially changes an internal state of the semiconductor storage device to the error correcting circuit encode state, to the power-OFF state, and to the centralized refresh state and, until instructions for exiting the ultra-low power consumption are provided, repeats transition from the centralized refresh state to the power-OFF state, from the power-OFF state to the power-ON state, and from the power-ON state to the centralized refresh state.

Also, a preferable mode is one wherein the controller, in the ultra-low power consumption mode, if the semiconductor storage device is put in the centralized refresh state when instructions for exiting the ultra-low power consumption mode are provided, changes an internal state of the semiconductor storage device to the error correcting circuit decode state and then induces occurrence of transition of an internal state of the semiconductor storage device to a self-refresh state in which a refresh process is performed on the memory cell in a period corresponding to a maintaining characteristic of the memory cell.

Also, a preferable mode is one wherein the controller, in the ultra-low power consumption mode, if the semiconductor storage device is put in the power-OFF state when instructions for exiting the ultra-low power consumption mode are provided, changes an internal state of the semiconductor storage device to the power-ON state and to the error correcting circuit decode state and then induces occurrence of transition of an internal state of the semiconductor storage device to a self-refresh state in which a refresh process is performed on the memory cell in a period corresponding to a maintaining characteristic of the memory cell.

Also, a preferable mode is one wherein the controller, in the ultra-low power consumption mode, if the semiconductor storage device is put in the error correcting circuit encode state when instructions for exiting the ultra-low power consumption mode are provided and after the error correcting circuit encode state has been terminated, induces occurrence of transition of an internal state of the semiconductor storage device to a self-refresh state in which a refresh process is performed on the memory cell in a period corresponding to a maintaining characteristic of the memory cell.

Also, a preferable mode is one wherein instructions for operations in the ultra-low power consumption mode are provided by a first change occurring in the specified signal and instructions for exiting the ultra-low power consumption mode are provided by a second change occurring in the specified signal.

Also, a preferable mode is one wherein, after the ultra-low power consumption mode has been exited, instructions for transition of an internal state of the semiconductor storage device into an idle state in which no operation is performed are provided by the second change again occurring in the specified signal.

Furthermore, a preferable mode is one wherein, after the second change has occurred in the specified signal which are used to provide instructions for exiting the ultra-low power consumption mode and when maximum time or more required for error correction in the error correcting circuit decode state has elapsed, the second change is produced in the specified signal to provide instructions for transfer of an internal state of the semiconductor storage device to the idle state.

With the above configurations, an ultra-low power consumption mode is employed in which power control can be exerted in a standby state. In the ultra-low power consumption mode, a centralized refresh state, power-OFF state, and power-ON state are provided. In the centralized refresh state, memory cells are refreshed in a centralized manner. In the power-OFF state, internal power source circuit can be partially turned OFF. In the power-ON state, the internal power source having been partially turned OFF is turned ON. Therefore, it is possible to greatly reduce power consumption in a standby state.

BRIEF DESCRIPTION OF THE DRAWINGS

The above and other objects, advantages, and features of the present invention will be more apparent from the following description taken in conjunction with the accompanying drawings in which:

FIGS. 2A and 2B are diagrams showing configurations of a main component of a peripheral circuit according to the embodiment of the present invention; wherein FIG. 2A is a circuit diagram showing one example of configurations of a main component of a row decoder and FIG. 2 is a circuit diagram showing one example of configurations of a main component of a random logic section according to the embodiment of the present invention;

FIG. 14 is a timing chart illustrating internal operations performed while the conventional semiconductor storage device is refreshed.

DETAILED DESCRIPTION OF THE PREFERRED EMBODIMENTS

Figure 1:
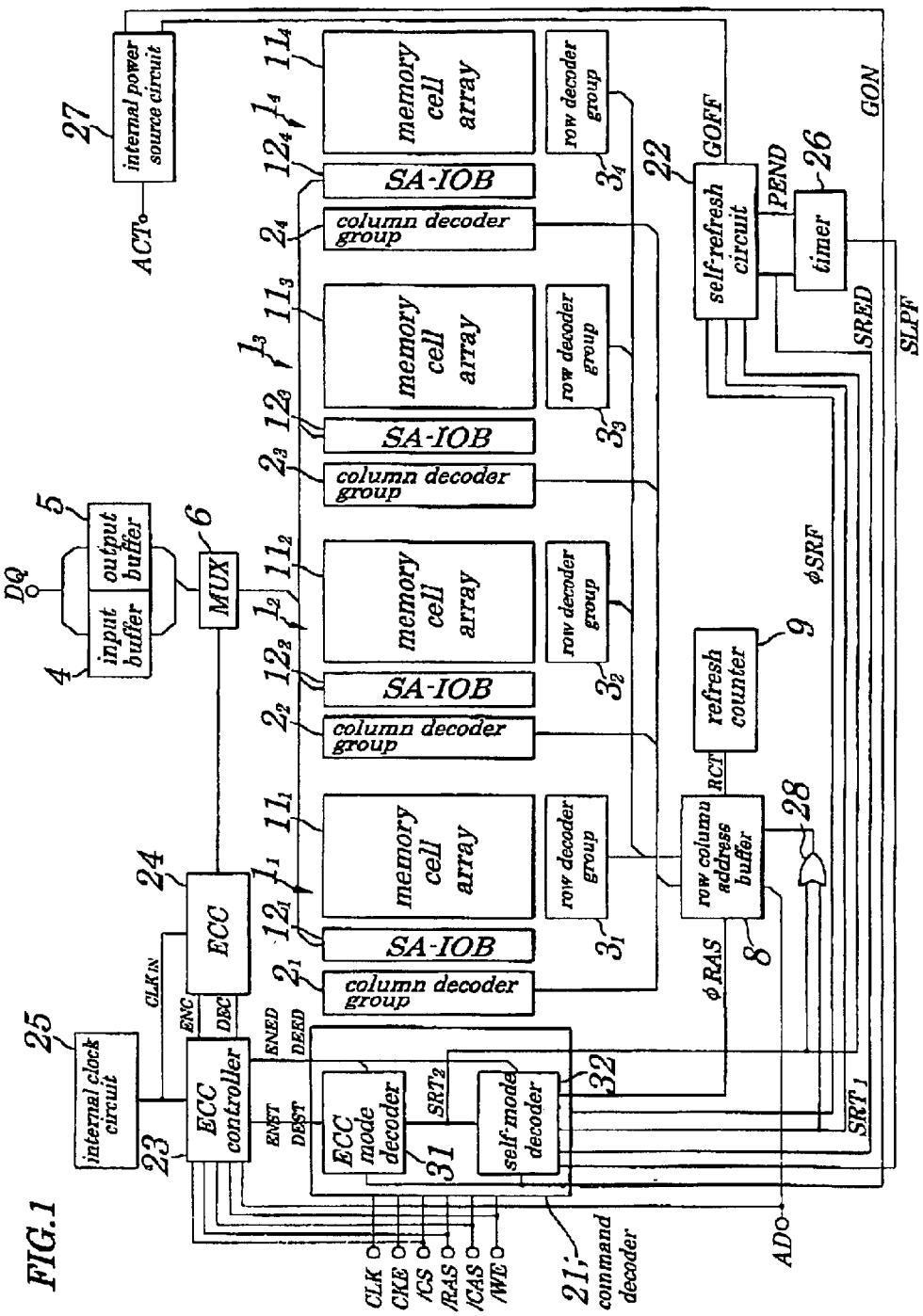
FIG. 1 is a schematic block diagram showing configurations of a semiconductor storage device employing a method for controlling power for the semiconductor storage device of an embodiment of the present invention.

Best modes of carrying out the present invention will be described in further detail using various embodiments with reference to the accompanying drawings.

In the present invention, by changing an internal state of a semiconductor storage device to a state obtained by combining an ECC (error correction circuit) encode state EEST, a burst self-refresh state BSST, a power-OFF state PFST, a power-ON state PNST, an ECC decode state EDST, and an ordinary self-refresh state SRST, great reduction in power consumption in the internal power source circuit in a stand-by state is achieved. Here, a mode in which the ECC encode state EEST, the burst self-refresh state BSST, the power-OFF state PFST, the power-ON state PNST, and the ECC decode state EDST are provided in combination to achieve great reduction in power consumption is called an "ultra-low power consumption mode".

The ECC encode state EEST represents a state in which reading and writing of data at a usual time which can be performed without a hitch by using an ECC circuit formed within a semiconductor chip and in which an arithmetic calculation of parity bits used to correct an error of a bit (refresh defective bit) being stored in a memory cell whose maintaining characteristics deteriorate and writing of a parity region into the memory cell are performed, The burst self-refresh state BSST represent a state in which a refresh process is collectively performed in a comparatively short refresh period $T_R$ (hereafter being called a "burst self-refresh") unlike an ordinary self-refresh in which a refresh process is performed in a disperse manner. For example, when the refresh period $T_R$ for the ordinary self-refresh is set to be 15.6 $\mu$sec according to real refreshing capability $t_{REF}$ (64 msec), the refresh period $T_R$ for the burst self-refresh is set to be several $\mu$sec. By performing the burst self-refresh, power-OFF time of the internal power source circuit is extended and, as a result, an amount of a direct current is greatly reduced.

The power-OFF state PFST represents a state in which current consumption in the internal power source circuit is reduced by turning OFF all power sources except paired poles making up the internal power source circuit during a non-operation period acquired by extending the refresh time in the ECC encode state EEST and by employing a peripheral circuit standby current reduction (SCRC) method by which a leak path of peripheral circuits of a memory cell array is interrupted, various kinds of leak currents such as the sub-threshold leak currents described above, minute leak currents, or a like are reduced. The power-ON state PNST represents a state in which, in order to perform the burst self-refresh in the subsequent burst self-refresh state BSST, the internal power source circuit is turned ON and operations using the peripheral circuit SCRC method are cancelled. The ECC decode state EDST represents a state in which an error of a refresh defective bit on which arithmetic calculations are performed is corrected. The self-refresh state SRST represents a state in which an ordinary self-refresh described in the conventional technology is performed, that is, refreshing in a memory cell is carried out in a refresh period $T_R$ according to a maintaining characteristic.

In the ECC encode state EEST and ECC decode state EDST, by extending apparent refresh time up to a maximum that can be assured by the characteristic, an amount of an alternating current can be reduced. For example, in the case of the semiconductor storage device whose real refreshing capability $t_{REF}$ being 64 msec, the apparent real refreshing capability is extended by about 1 sec. Moreover, by repetition of the above burst self-refresh state BSST, the power-OFF state PFST, and the power-ON state PNST, an amount of a direct current is reduced. By operating the semiconductor storage device in the ultra-low power consumption mode, an average amount of current consumption at a time of maintaining data can be reduced to about one-tenth of the level in the conventional art.

Embodiment

Figure 13:
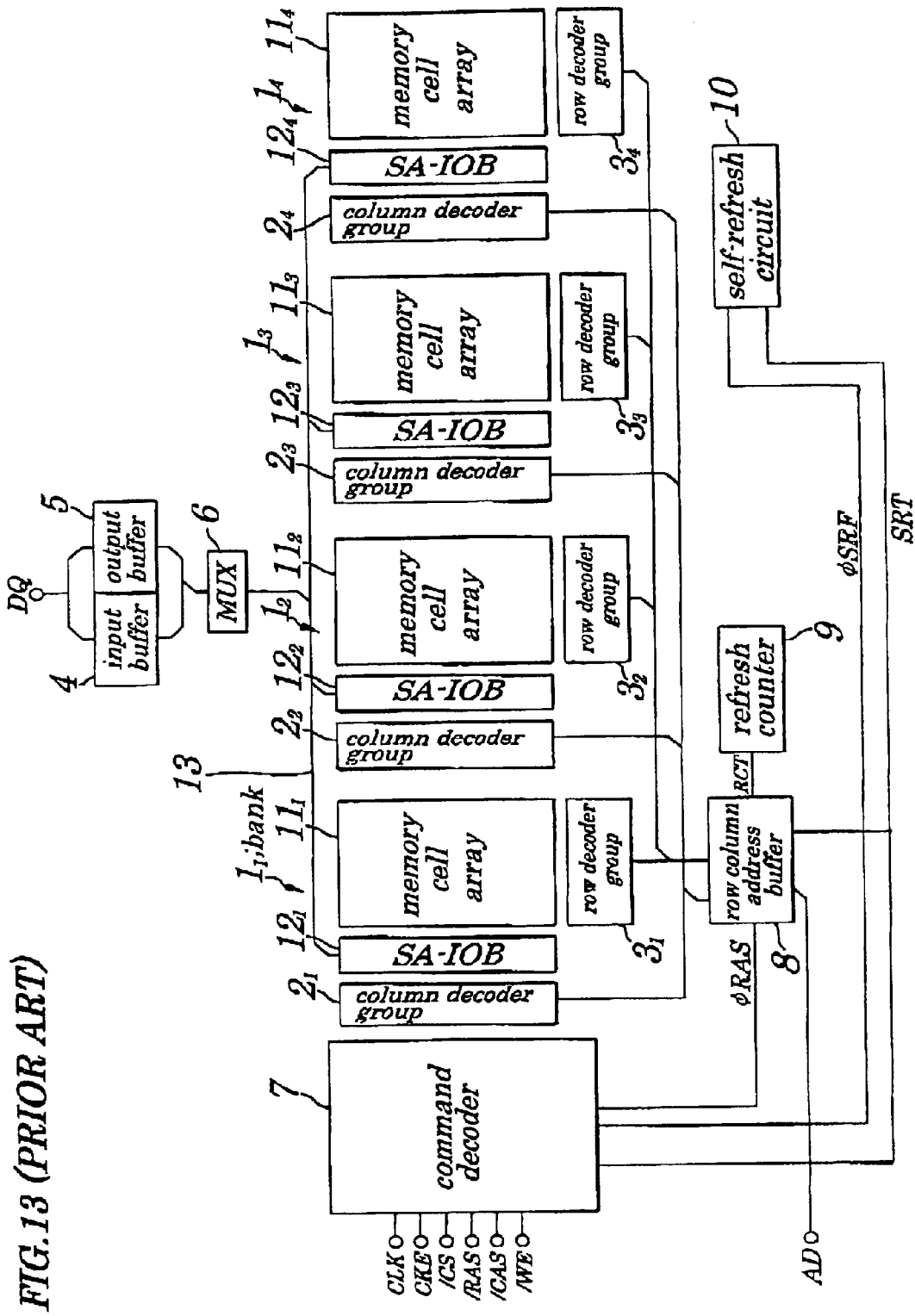
FIG. 13 is a block diagram showing an example of configurations of a conventional semiconductor storage device.

FIG. 1 is a schematic block diagram for showing configurations of a semiconductor storage device employing a method for controlling power for the semiconductor storage device employed in an embodiment of the present invention. In FIG. 1, same reference numbers are assigned to corresponding parts having same functions as in FIG. 13 and their descriptions are omitted accordingly. In the semiconductor storage device shown in FIG. 1, instead of a command decoder 7 and a self-refresh circuit 10, a command decoder 21 and a self-refresh circuit 22 are newly mounted. As shown in FIG. 1, an ECC controller 23, an ECC 24, an internal clock generating circuit 25, a timer 26, an internal power source circuit 27, and an OR gate 28 are newly added. Moreover, though the internal power source circuit is provided in the semiconductor storage device, too, since an internal voltage $V_{DDI}$ is always fed to each of components while operations are in a self-refresh mode, no special explanation is provided. A real refreshing capability of the semiconductor storage device of the embodiment is set to be 64 msec.

In the command decoder 21, in addition to a function of a conventional command decoder, an ECC mode decoder 31 and a self-mode decoder 32 are additionally added. The command decoder 21, based on a self-refresh signal φ SRF supplied from the self-refresh circuit 22, produces a row activated signal φ RAS and feeds it to a row column address buffer 8. The ECC mode decoder 31, when a clock enable signal CKE fed from an external changes from its high to low level, decodes a chip select signal/CS, a row address strobe signal/RAS, a column address strobe signal/CAS, and a write enable signal/WE, all of which are fed in synchronization with a clock CLK supplied from the external and, when it is judged that setting is made so as to operate the semiconductor storage device in an ultra-low power consumption mode, produces a high-level encode start signal ENST, then feeds it to the ECC controller 23 and sets the ultra-low power consumption flag SLPF showing that the setting is made so as to operate the semiconductor storage device in the ultra-low power consumption mode and an encode flag showing that the ECC 24 is performing its encoding process. Then, when an encoder terminating signal ENED indicating that encoding process has terminated in the ECC 24 is supplied from the ECC controller 23, the ECC mode decoder 31 resets the encode flag.

Moreover, the ECC mode decoder 31, when an instruction for exiting the ultra-low power consumption mode is provided from an external by a change of the clock enable signal CKE from its high to low level, resets the above ultra-low power consumption flag SLPF. At this point, the ECC mode decoder 31, depending on whether the encode flag has been set or reset, judges whether a state having just existed till now is an ultra-low power consumption mode and the ECC 24 has terminated its encoding operations or whether the state having just existed till now is an ordinary self-refresh mode in which the ECC 24 has not yet performed its encoding operations. Then, if operations are in the ultra-low power consumption mode and the ECC 24 has terminated its encoding operations, the ECC mode decoder 31 produces a high-level decode start signal DEST, then feeds it to the ECC controller 23 and sets a decode flag indicating that the ECC 24 is under decoding. Next, when a decode terminating signal DEED indicating that decoding in the ECC 24 has terminated is fed from the ECC controller 23, the ECC mode decoder 31 resets a decode flag.

Moreover, the ECC mode decoder 31, if the ultra-low power consumption flag SLPF is set when an "internal power source ON signal" GON, being fed from the internal power source circuit 27, and informing that a potential at an internal specified portion has reached a specified potential and that the internal power source has been turned ON, is changed from its low to high level, makes high a second self-refresh start signal $SRT_2$. On the other hand, when the "internal power source ON signal" GON changes from its low to high level, if the ultra-low power consumption flag SLPF is set, since the second self-refresh start signal $SRT_2$ goes high, the ECC mode decoder 31 produces a high-level decode start signal DEST, then feeds it to the ECC controller 23 and sets a decode flags.

The self-mode decoder 32, when a clock enable signal CKE fed from the external is changed from its high to low level, decodes the chip select signal/CS, the row address strobe signal/RAS, the column address strobe signal/CAS, and the write enable signal/WE, all of which are fed in synchronization with the clock CLK supplied from the external and, when it is judged that setting is made so as to operate the semiconductor storage device not in the ultra-low power consumption mode but in the ordinary self-refresh mode, produces a high-level first self-refresh start signal $SRT_1$ and feeds it to the self-refresh circuit 22 and the OR gate 28. Also, the self-mode decoder 32, when a clock enable signal CKE fed from the external is changed from its high to low level, decodes the chip select signal/CS, the row address strobe signal/RAS, the column address strobe signal/CAS and the write enable signal/WE, all of which are fed in synchronization with the clock CLK fed from the external and, when setting is made so as to operate the semiconductor storage device in the ultra-low power consumption mode, sets the ultra-low power consumption flag SLPF indicating that operations are in the ultra-low power consumption. Moreover, the self-mode decoder 32, when an instruction for exiting the ultra-low power consumption mode is fed due to a change of a clock enable signal CKE fed from the external from its high to low level, resets the ultra-low power consumption mode and, regardless of levels of the first and second self-refresh start signals $SRT_1$ and $SRT_2$, resets the first and second self-refresh start signal $SRT_1$ and $SRT_2$ to become at a low level.

Furthermore, the self-mode decoder 32, when an encode terminating signal ENED is fed from the ECC controller 23 and if the above ultra-low power consumption flag SLPF is set, produces a high-level second self-refresh start signal $SRT_2$ and feeds it to the self-refresh circuit 22, the OR gate 28, and the ECC mode decoder 31. Similarly, the self-mode decoder 32, when an "internal power source ON signal" GON fed from the internal power source circuit 27 is changed from its low to high level and if the ultra-low power consumption flag SLPF is set, produces a second high-level self-refresh start signal $SRT_2$ and feeds it to the self-refresh circuit 22, the OR gate 28 and the ECC mode decoder 31. Moreover, the self-mode decoder 32, when the decode terminating signal DEED is fed, produces a first high-level self-refresh start signal $SRT_1$ and feeds it to the self-refresh circuit 22 and the OR gate 28.

The self-refresh circuit 22 changes, based on first and second high-level self-refresh start signals $SRT_1$ and $SRT_2$ fed from the self-mode decoder 32, an oscillation frequency of the clock produced by an oscillator mounted therein and produces a self-refresh signal $\phi$ SRF and feeds it to the command decoder 21. The self-refresh circuit 22, when the first high-level self-refresh start signal $SRT_1$ is fed, sets the oscillation frequency of a clock produced by the oscillator so that the refresh period $T_R$ becomes 15.6 $\mu$sec and, when the second high-level self-refresh start signal $SRT_2$ is fed, the oscillation frequency of the clock produced by the oscillator so that the refresh period $T_R$ becomes several microseconds.

Also, the self-refresh circuit 22, when a value of a counter mounted therein becomes 4096 by termination of the burst self-refresh process on all word lines in all memory cell arrays $11_1$ to $11_4$, produces a high-level self-refresh terminating signal SRED indicating that the burst self-refresh process has terminated and feeds it to the self-mode decoder 32 and the timer 26. Moreover, the self-refresh circuit 22, based on the self-refresh terminating signal SRED, produces a high-level "internal power source OFF signal" GOFF to instruct the internal power source circuit 27 to be turned OFF. Also, the self-refresh circuit 22, based on an "internal power source OFF terminating signal" PEND, being fed from the timer 26, indicating that time (being called "internal power source OFF time") required to turn OFF the internal power source circuit 27 has elapsed, changes the "internal power source OFF signal" PEND from its high to low level to activate the internal power source circuit 27 and feeds it to the internal power source circuit 27.

The ECC controller 23, based on a high-level encode start signal ENST fed from the ECC mode decoder 31, produces an internal command, an address AD, and an encode flag ENC used to control reading and writing operations during encoding in synchronization with an internal clock $CLK_{IN}$ being supplied from the internal clock generating circuit 25 and feeds the internal command and the address AD to the command decoder 21 and the encode flag ENC to the ECC 24. Here, the internal command is made up of the chip select signal/CS, the row address strobe signal/RAS, the column address strobe signal/CA and the write enable signal/WE. The command decoder 21 takes in an internal command by a rising edge occurring when the internal clock $CLK_{IN}$ is changed from its low to high level. The ECC controller 23, when parity calculation to be performed on all memory cells making up the memory cell arrays $11_1$ to $11_4$ and writing of a parity region into each of the memory cells are terminated in the ECC 24, feeds an encoder terminating signal ENED to the ECC mode decoder 31. Moreover, the ECC controller 23, based on a high-level decode start signal DEST fed from the ECC mode decoder 31 and in synchronization with an internal clock $CLK_{IN}$, produces the internal command, the address AD, and the decode flag DEC each being used to control reading and writing operations in the decode and feeds the internal command and the address AD to the command decoder 21 and encode flag ENC to the ECC 24. Then, the ECC controller 23, when the decoding instructed as above in the ECC 24 is terminated, feeds a decode terminating signal DEED to the ECC mode decoder 31 and self-mode decoder 32.

The ECC 24, based on an encode flag ENC fed from the ECC controller 23 and in synchronization with an internal clock $CLK_{IN}$ fed from the internal clock generating circuit 25, makes an access through a MUX 6 to each of banks $1_1$ to $1_4$, and performs arithmetic calculation of parity bits used to correct errors of a refresh defective bit and writing of a parity region into the memory cell. Also, the ECC 24, based on a decode flag DEC fed from the ECC controller 23, makes an access through the MUX 6 to each of the banks $1_1$ to $1_4$ in synchronization with an internal clock $CLK_{IN}$ and corrects an error of a refresh defective bit having performed arithmetic calculations of parity bits. Error correcting capability of the ECC 24, if a storage capacity of the semiconductor storage device is, for example, 64 Mbits, may be about 1,000 to 10,000 bits. The internal clock generating circuit 25 produces an internal clock $CLK_{IN}$ to be used in the ECC controller 23 and the ECC 24. The timer 26, based on a high-level self-refresh terminating signal SRED fed from the self-refresh circuit 22, starts a measurement of time of the internal power source OFF time which is set in advance and is programmed by using a fuse or a like and, when the internal power source OFF time has elapsed, feeds an "internal power source OFF terminating signal" PEND indicating its lapse to the self-refresh circuit 22. The timer 26, while the internal power source OFF time is being measured, if the ultra-low power consumption flag SLPF fed from the self-mode decoder 32 by changes of the clock enable signal CKE from its low to high level is reset, stops the measurement of the internal power source OFF time and feeds a high-level "internal power source OFF signal" PEND to the self-refresh circuit 22.

The internal power source circuit 27 feeds various voltages occurring within each component of the semiconductor storage device including, for example, a word line potential $V_{PP}$, a bit line potential $V_{ARY}$, a potential being one half of the bit line potential, a paired pole potential $V_{PLT}$, a peripheral circuit potential $V_{PER}$, a memory cell section substrate potential $V_{BB}$ and a high-level activated signal ACT used to supply the above internal voltage or external voltage $V_{DDE}$ to column decoders making up column decoder groups $2_1$ to $2_4$, row decoders making up row decoder groups $3_1$ to $3_4$ or a peripheral circuit (FIGS. 2A and 2B) made up of random logic sections or a like. The internal power source circuit 27, based on a high-level "internal power source OFF signal" GOFF, stops a supply of an internal voltage to the semiconductor storage device and changes an activated signal ACT from its high to low level and then feeds it to the above peripheral circuit. Moreover, the internal power source circuit 27, when the "internal power source OFF signal" GOFF fed from the self-refresh circuit 22 is changed from its high to low level, starts a supply of an internal voltage to the semiconductor storage device and changes the above activated signal ACT to its low to high level and feeds it to the above peripheral circuit.

Figure 2A:
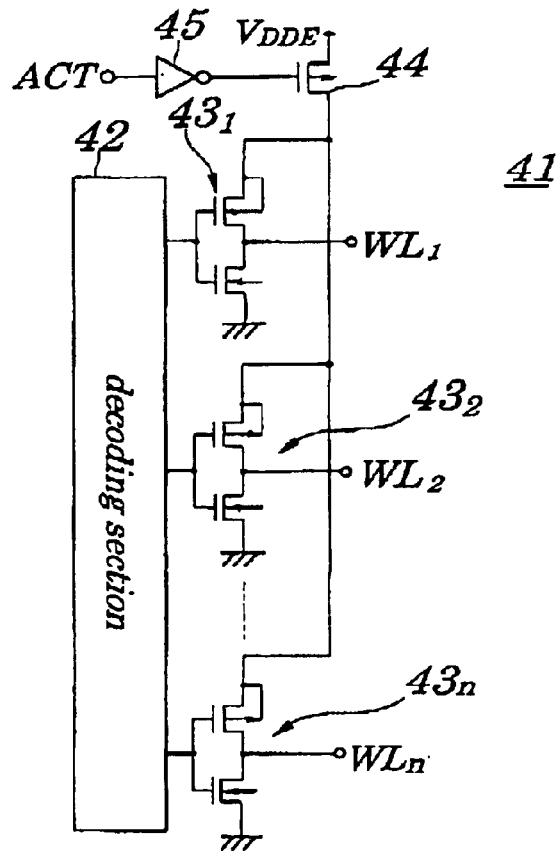
Figure 2B:
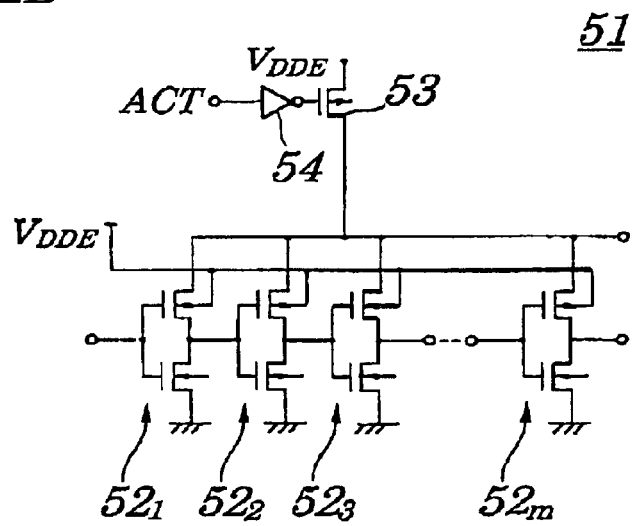

FIGS. 2A and 2B are diagrams showing configurations of main components of the peripheral circuit of the embodiment of the present invention. FIG. 2A shows an example of configurations of the main component of a row decoder 41. In the row decoder 41, at a later stage of a decoding section 42 used to decode a row address, inverters $43_1$ to $43_n$ each being made up of P-channel MOS transistors and N-channel MOS transistors are provided as an output section and each of output terminals of the inverters $43_1$ to $43_n$ ("n" representing a natural number) is connected to each of corresponding word lines $WL_1$ to $WL_n$ of the corresponding memory cell array $11_1$, $11_2$, $11_3$, or $11_4$. To each of sources of the P-channel MOS transistors making up each of inverters $43_1$ to $43_m$, a drain of the P-channel MOS transistors 44 making up a power source interrupting section is connected. To a source of a MOS transistor 44 is applied an external voltage $V_{DDE}$ and to its gate is applied an activated signal ACT through an inverter 45 making up a power supply interrupting section. Therefore, at a time of a power-OFF state PFST, when the activated signal ACT changes from its high to low level, since the MOS transistor 44 is turned OFF, production of a sub-threshold leak current of the row decoder 41 is inhibited FIG. 2B shows an example of configurations of main components of a random logic section 51.

In the random logic section 51, "m" pieces of inverters $52_1$ to $52_m$ (m is a natural number) each being made up of P-channel MOS transistors and N-channel MOS transistors are cascaded. To each of sources of the P-channel MOS transistors making up each of inverters $52_1$ to $52_m$, a drain of the P-channel MOS transistors 53 making up a power source interrupting section is connected. To a source of the MOS transistor 53 is applied an external voltage $V_{DDE}$ and to its gate is applied an activated signal ACT through an inverter 54 making up the power source interrupting section. Therefore, when the activated signal ACT is changed from its high to low level at a time of power-OFF state PFST, since the MOS transistor 53 is turned OFF, occurrence of the sub-threshold leak current in the random logic section 51 is inhibited.

The internal power source circuit 27, since it takes much time for example, about 200 $\mu$sec) to supply, in a stable manner, an internal voltage having a specified value after operations have been started, monitors a potential at which it takes most time to reach the potential having the specified value described above, out of potentials applied to each component, and then detects that the potential has reached that having the specified value and supplies a high-level "internal power source ON signal" GON to the ECC mode decoder 31 and the self-mode decoder 32. The potential to be supplied by the internal power source circuit 27, as described above, generally includes a word line potential $V_{PP}$, a bit line potential $V_{ARY}$, a potential being one half of that of a bit line, a paired pole potential $V_{PLT}$, a peripheral circuit potential $V_{PER}$, and a memory cell portion substrate potential $V_{BB}$ or a like. Of them, a potential at which it takes most time to reach the potential having the specified value is the word line potential $V_{PP}$ or the memory cell portion substrate potential $V_{BB}$. The above time is determined by current supplying capability of the internal power source circuit 27 and by load capacity existing therein. The current supplying capability of the internal power source circuit 27 is ordinarily determined so that the potential reaches that having the specified value at the time when 100 $\mu$sec have elapsed in an initializing sequence at a time of design. For example, if there exists a large parasitic capacity between the memory section substrate potential $V_{BB}$ and the word line potential $V_{PP}$, it is necessary that a supply of the word line potential $V_{PP}$ is started after having the memory section substrate potential $V_{BB}$ reach a specified potential value, the word line potential $V_{PP}$ is a potential at which most time is required to reach the specified potential value. A reason why the potential is applied in such order as described above is to avoid a risk of breaking data being stored in a memory cell occurring when the potential $V_{BB}$ of the memory cell section substrate is made positive by having the word line potential $V_{PP}$ reach a specified potential value. The OR gate 85 operates to OR a first refresh start signal with a second refresh signal and applies its calculation result to the row column address buffer 8.

Operations of the semiconductor storage device having the configurations described above will be explained. First, internal operations being performed at an ultra-low power consumption mode will be described by referring to a timing chart shown in FIGS. 3, 4, and 7 and to a state transition diagram shown in FIGS. 4, 6, and 8.

Figure 3:
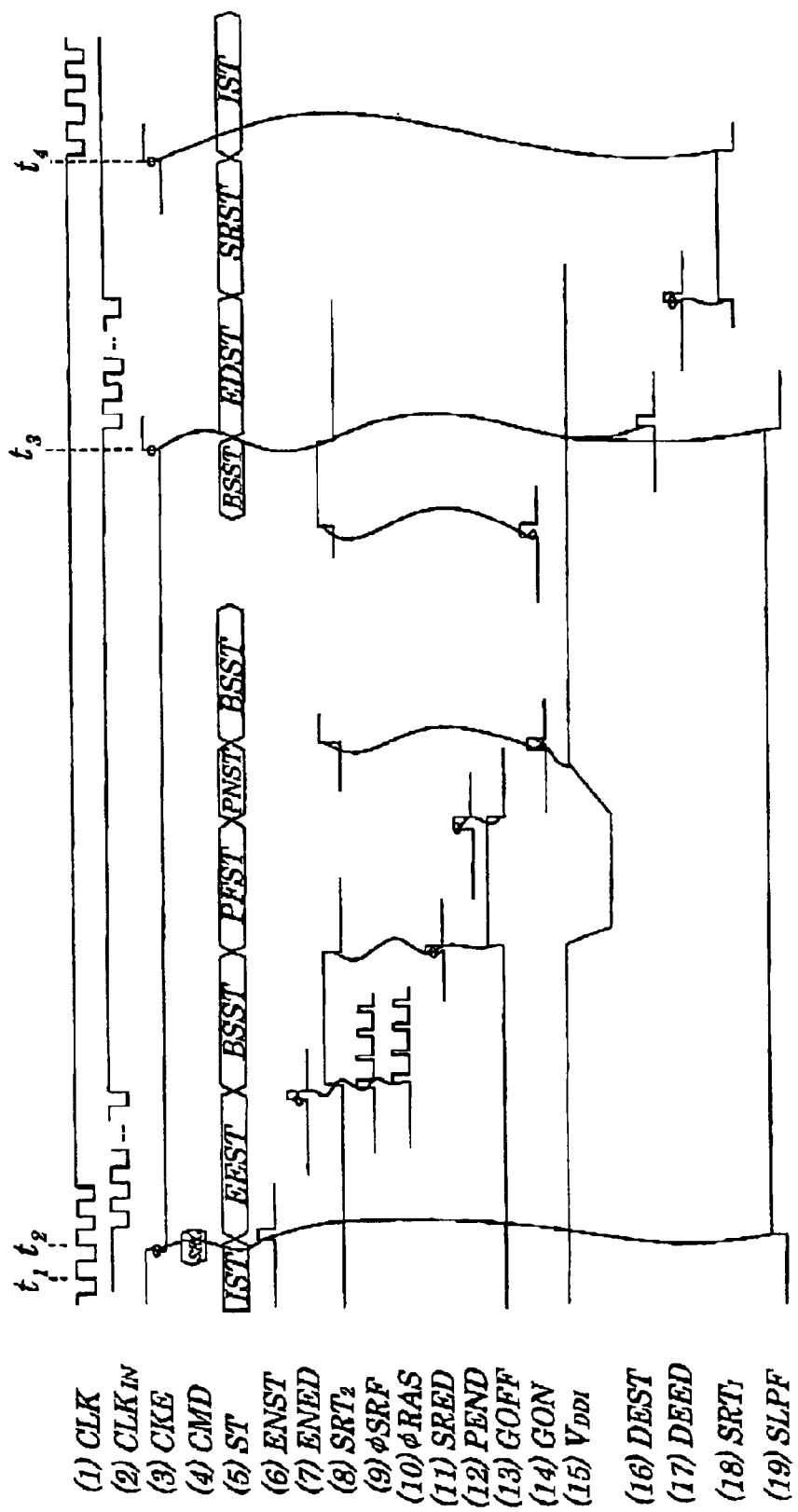
FIG. 3 is a timing chart explaining internal operations performed when an ultra-low power consumption mode exits in a burst self-refresh state after the semiconductor storage device has been put in the ultra-low power consumption mode according to the embodiment of the present invention.
Figure 4:
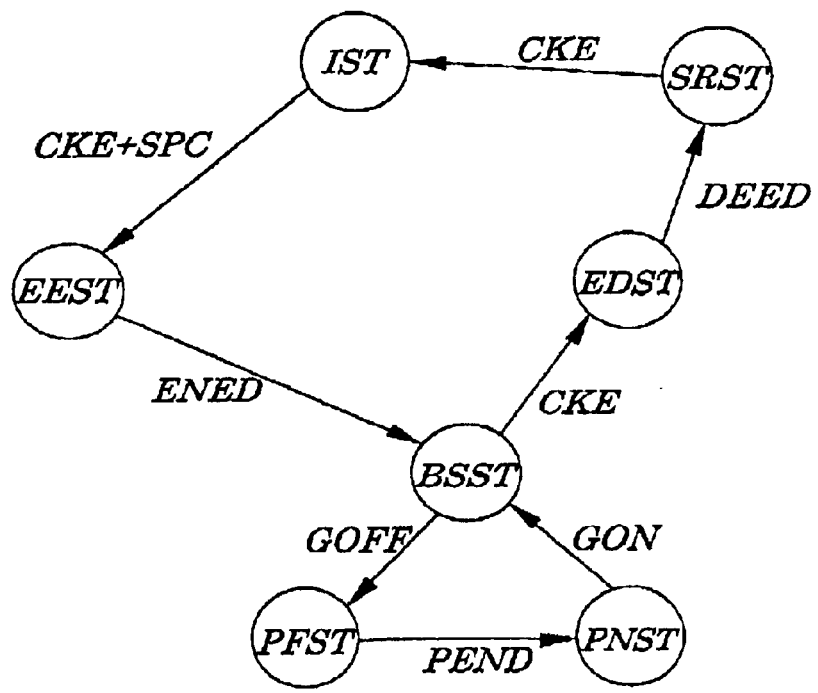
FIG. 4 is a state transition diagram for explaining internal operations performed when the ultra-low power consumption mode exits in a burst self-refresh state after the semiconductor storage device has been put in the ultra-low power consumption mode according to the embodiment of the present invention.

(1) Case in which, the semiconductor storage device, having been set to an ultra-low power consumption mode, exits it at a burst self-refresh state "BSST" (see FIGS. 3 and 4).

Here, let it be assumed that a clock enable signal CKE, as shown in FIG. 3(3), remains high in an initial state before a time $t_1$ and it changes to become low in synchronization with a rise of a clock CLK (see FIG. 3(1)) at a time $t_2$. That is, the internal state ST of the semiconductor storage device of the embodiment is, as shown in FIG. 3(5) and FIG. 4, an idle state IST in which no operation is performed at the idle time.

In such the initial state, the clock enable signal CKE, as shown in FIG. 3(3), changes to become low in synchronization with a rise of the clock CLK (see FIG. 3(1)) at the time $t_2$ and, at the same time, a command SPC being one of the commands CMP is supplied, as shown in FIG. 3(4), to issue an instruction for setting the ultra-low power consumption mode. The command SPC is supplied when, for example, a low chip selector signal/CS, a high-level row address strobe signal/RAS, a high column address strobe signal/CAS and a low level write enable signal/WE are fed in synchronization with the clock CLK. This causes the internal state ST of the semiconductor storage device of the embodiment to be changed from its idle state IST to the ECC encode state EEST as shown in FIG. 3(5) and FIG. 4. The ECC mode decoder 31 and self-mode decoder 32 making up the command decoder 21 decode a low-level chip select signal/CS, a high-level row address strobe signal/RAS, a high column address strobe signal/CA, and a low-level write-enable signal/WE, all of which are the command SPC, and judges that the semiconductor storage device is in an ultra-low power consumption mode. Therefore, the ECC mode decoder 31 produces a high-level encode start signal ENST and feeds it to the ECC controller 23 and sets an ultra-low power consumption flag SLPF (see FIG. 3(19)) and an encoder flag. On the other hand, the self-mode decoder 32 sets an ultra-low power consumption flag SLPF.

The ECC controller 23, based on a high-level encode start signal ENST, in synchronization with an internal clock $CLK_{IN}$ shown in FIG. 3(2), produces an internal command, address AD, and encode flag ENC and feeds the internal command and address AD to the command decoder 21 and the encode flag ENC to the ECC 24. This causes the ECC 24 to access the banks $1_1$ to $1_4$ through the MUX 6, based on the encode command ENC and in synchronization with the internal clock $CLK_{IN}$ shown in FIG. 3(2) and activates appropriate word lines of each of memory cell arrays $11_1$ to $11_4$ and performs arithmetic calculations on parity bits used to correct a refresh defective bit and writing of a parity region to a memory cell. Then, the ECC controller 23, when the arithmetic calculation of parity bits on all memory cells making up each of memory cell arrays $11_1$ to $11_4$ and writing of a parity region to a memory cell are completed in the ECC 24, feeds a high-level encode terminating signal END shown in FIG. 3(17) to the ECC mode decoder 31 and self-mode decoder 32. Therefore, the ECC mode decoder 31, when the encode terminating signal ENED is fed from the ECC controller 23, resets an encode flag. On the other hand, the self-mode decoder 32, when the encode terminating signal ENED is fed from the ECC controller 23, since the ultra-low power consumption flag is set in this case, produces a high-level second self-refresh start signal $SRT_2$ shown in FIG. 3(18) and feeds it to the self-refresh circuit 22, OR gate 28 and ECC mode decoder 31.

This causes the internal state ST of the semiconductor storage device of the embodiment to be changed from the ECC encode state EEST to the burst self-refresh state BSST. That is, the self-refresh circuit 22, since a high-level second self-refresh start signal $SRT_2$ is fed, after having set an oscillation frequency of a clock produced by the oscillator so that a refresh period $T_R$ is several μsec, produces a self-refresh signal φ SRF shown in FIG. 3(9) and feeds it to the row column address buffer 8 and the command decoder 21. This causes the command decoder 21 to produce a row activated signal φ RAS as shown in FIG. 4(10) and feeds it to the row column address buffer 8.

Therefore, the row column address buffer 8, when a second self-refresh start signal $SRT_2$ is fed through the OR gate 28, based on a counter value RCT fed from the refresh counter 9, produces a row address for a burst self-refresh process and then feeds it, with timing when the row activated signal φ RAS is fed, to a plurality of row decoders making up each of row decoder groups $3_1$ to $3_4$. Thereafter, in the semiconductor storage device of the embodiment, refreshing operations are performed at equal intervals on all word lines (4096 cycles) in a refresh period $T_R$ of several μsec.

Then, the self-refresh circuit 22, when a counter value provided therein becomes 4096 by completion of the burst self-refresh process to be performed on all word lines of all the memory cells array $11_1$ to $11_4$, produces a high-level self-refresh terminating signal SRED shown in FIG. 3(11) and feeds it to the self-mode decoder 32 and timer 26. Moreover, the self-refresh circuit 22, based on a self-refresh terminating signal SRED, produces a high-level "internal power source OFF signal" GOFF and feeds it to the internal power source circuit 27.

This causes the internal state ST of the semiconductor storage device of the embodiment to be changed from the burst self-refresh state BSST to the power-OFF state PFST. That is, the internal power source circuit 27, based on a high-level "internal power source OFF signal" GOFF, stops a supply of an internal voltage to the semiconductor storage device and, by changing an activated signal ACT from its high to low level, an internal voltage being fed to peripheral circuits constructed of column decoders making up column decoder groups $2_1$ to $2_4$, row decoders making up row decoder groups $3_1$ to $3_4$, random logic sections, or a like is shut off from an external voltage $V_{DDE}$. As a result, as shown in FIG. 3(15), since the internal voltage is lowered, power consumption in the internal power source circuit 27 is reduced and a leak current flowing from its internal power source circuit 27 (a short providing low resistance and a sub-threshold leak current) is also reduced. Moreover, in the peripheral circuits, the sub-threshold leak current is interrupted. On the other hand, the timer 26, based on a high-level self-refresh terminating signal SRED, starts measurements of the internal power source OFF time. Then, if the internal power source off time has elapsed, the timer 26 feeds a high-level "internal power source OFF signal" PEND shown in FIG. 3(12) to the self-refresh circuit 22. Therefore, the self-refresh circuit 22, based on the high-level "internal power source OFF signal" PEND, to activate the internal power source circuit 27, as shown in FIG. 3(13), by having changed the "internal power source OFF signal" GOFF from its high to low level, feeds the "internal power source OFF signal" GOFF to the internal power source circuit 27.

This causes the internal state ST of the semiconductor storage device of the embodiment to be changed from its power-OFF state PFST to its power-ON state PNST. That is, the internal power source circuit 27, since the "internal power source OFF signal" GOFF is changed from its high to low level, as shown in FIG. 3(15), starts a supply of the internal voltage to each of components of the semiconductor storage device. The internal power source circuit 27, when having detected that a potential being monitored (in this case, word line potential $V_{PP}$) reaches a specified value of a potential, feeds the high-level "internal power source ON signal" GON shown in FIG. 3(14) to the ECC mode decoder 31 and self-mode decoder 32. Therefore, the self-decoder 32, since the "internal power source ON signal" GON is changed from its low to high level and since the ultra-low power consumption flag is set, produces a high-level second self-refresh start signal $SRT_2$ and feeds it to the self-refresh circuit 22, the OR gate 28, and ECC mode decoder 31. On the other hand, the ECC mode decoder 31, though its "internal power source ON signal" GON is changed from its low to high level, since the ultra-low power consumption flag SLPF is set, no operation is performed.

This causes an internal state ST of the semiconductor storage device of the embodiment to be changed to a power-ON state PNST to a burst self-refresh state BSST. Thereafter, until a clock enable signal CKE shown in FIG. 3(3) is changed from its low to high level, the internal state ST of the semiconductor storage device of the embodiment, as shown in FIG. 4 repeats transition from its burst self-refresh state BSST to its power-OFF state PFST, from its power-OFF state PFST to its power-ON state PNST, and from its power-ON state PNST to its burst self-refresh state BSST.

Then, as shown in FIG. 3(3), let it be assumed that, at the time $t_3$ when the internal state ST of the semiconductor storage device of the embodiment is a burst self-refresh state BSST, to exit the ultra-low power consumption mode, the clock enable signal CKE is changed from its low to high level. This causes the self-mode decoder 32 to reset the ultra-low power consumption flag and, as shown in FIG. 3(8), to change a second self-refresh start signal $SRT_2$ from its high to low level and then feeds it to the self-refresh circuit 22, OR gate, and ECC mode decoder 31. Moreover, the ECC mode decoder 31, in response to a change of the clock enable signal CKE from its high to low level, as shown in FIG. 3(19), resets the ultra-low power consumption flag. Therefore, the ECC mode decoder 31, since the ultra-low power consumption flag SLPF is reset in this case and the encode flag is reset, judges that a state having existed till then is an ultra-low power consumption state and in a state where the ECC 24 has terminated its encoding operations. The ECC mode decoder 31 produces a high-level decode start signal DEST shown in FIG. 3(16), feeds it to the ECC controller 23 and sets the decode flag.

This causes the internal state ST of the semiconductor storage device of the embodiment to be changed and, as shown in FIG. 3(5) and FIG. 4, transition from its burst self-refresh state BSST to its ECC decode EDST occurs. That is, the self-refresh circuit 22, based on the low-level second self-refresh start signal $SRT_2$, stops the production of the self-refresh signal φ SRF. As a result, the command decoder 21, since the self-refresh signal φ SRF is not fed from the self-refresh circuit 22, stops the production of the row activated signal φ RSA. On the other hand, the ECC controller 23, based on a high-level decode start signal DEST, in synchronization of an internal clock $CLK_{IN}$ shown in FIG. 3(2), produces an internal command used to control reading and writing operations while the decoding is performed, an address AD, and a decode flag DEC and supplies the internal command and the address AD to the command decoder 21 and the encode flag ENC to the ECC 24. This causes the ECC 24 to access the banks $1_1$ to $1_4$ through the MUX 6 in synchronization with an internal clock $CLK_{IN}$ shown in FIG. 3(2) and to make a correction to errors in a refresh failure bit on which arithmetic calculation of parity bits has been performed. Then, the ECC controller 23, when the instructed decoding operation has been terminated in the ECC 24, feeds a high-level decode terminating signal DEED shown in FIG. 3(7) to the ECC mode decoder 31 and self-mode decoder 32. As a result, the ECC mode decoder 31 resets a decode flag. On the other hand, the self-mode decoder 32, based on a high-level decode terminating signal DEED, produces a high-level first self-refresh start signal $SRT_1$ shown in FIG. 3(8) and feeds it to the self-refresh circuit 22 and the OR gate 28.

This causes the internal state ST of the semiconductor storage device of the embodiment to be changed from its ECC decode state to its self-refresh state SRST state. That is, the self-refresh circuit 22, since a first high-level self-refresh start signal $SRT_1$ has been fed, sets an oscillation frequency of a clock produced by the oscillator so that the refresh period $T_R$ becomes 15.6 μsec and produces a self-refresh signal φ SRF and feeds it to the row column address buffer 8 and the command decoder 21. This causes the command decoder 21 to produce a row activated signal φ RSA and to feed it to the row column address buffer 8.

Therefore, the row column address buffer 8, when a first self-refresh start signal $SRT_1$ is fed through the OR gate 28, based on a counter value RCT fed from the refresh counter 9, produces a row address for an ordinary self-refresh process and feeds it to a plurality of row decoders making up each of the row decoder groups $3_1$ to $3_4$ with timing when a row activated signals φ RSA is fed. Thereafter, in the semiconductor storage device of the embodiment, refreshing operations are performed at equal intervals on all word lines (4096 cycles) in a refresh period $T_R$ of 15.6 μsec.

Next, to exit the self-refresh state SRST, for example, at the time $t_4$, as shown in FIG. 3(3), the clock enable signal CKE is changed from its low to high level. This causes the self-mode decoder 32 to change the first self-refresh start signal $SRT_1$ from its high to low level as shown in FIG. 3(18) and feeds it to the self-refresh circuit 22 and to the OR gate 28. Therefore, the self-refresh circuit 22, based on a low-level first self-refresh start signal $SRT_1$, stops the production of the self-refresh signal φ SRF. As a result, the command decoder 21, since a self-refresh signal φ SRF is not fed from the self-refresh circuit 22, stops the production of the row activated signals φ RSA. By operations described above, the internal state ST of the semiconductor storage device of the embodiment, as shown in FIG. 3(5) and FIG. 4, is changed from its self-refresh state SRST to its idle state IST. Moreover, in the semiconductor storage device described above, a reason why a direct transition from the ECC decode state EDST to the idle state IST does not occur is as follows. That is, since internal operations are performed in synchronization with an internal clock $CLK_{IN}$, if an error correction caused by variations of an internal clock $CLK_{IN}$ terminates earlier and then if transition of the internal state ST to the idle state IST occurs without transition to its ordinary self-refresh mode and remains left as it is, there is a risk that data being stored in each of memories is destroyed.

Figure 5:
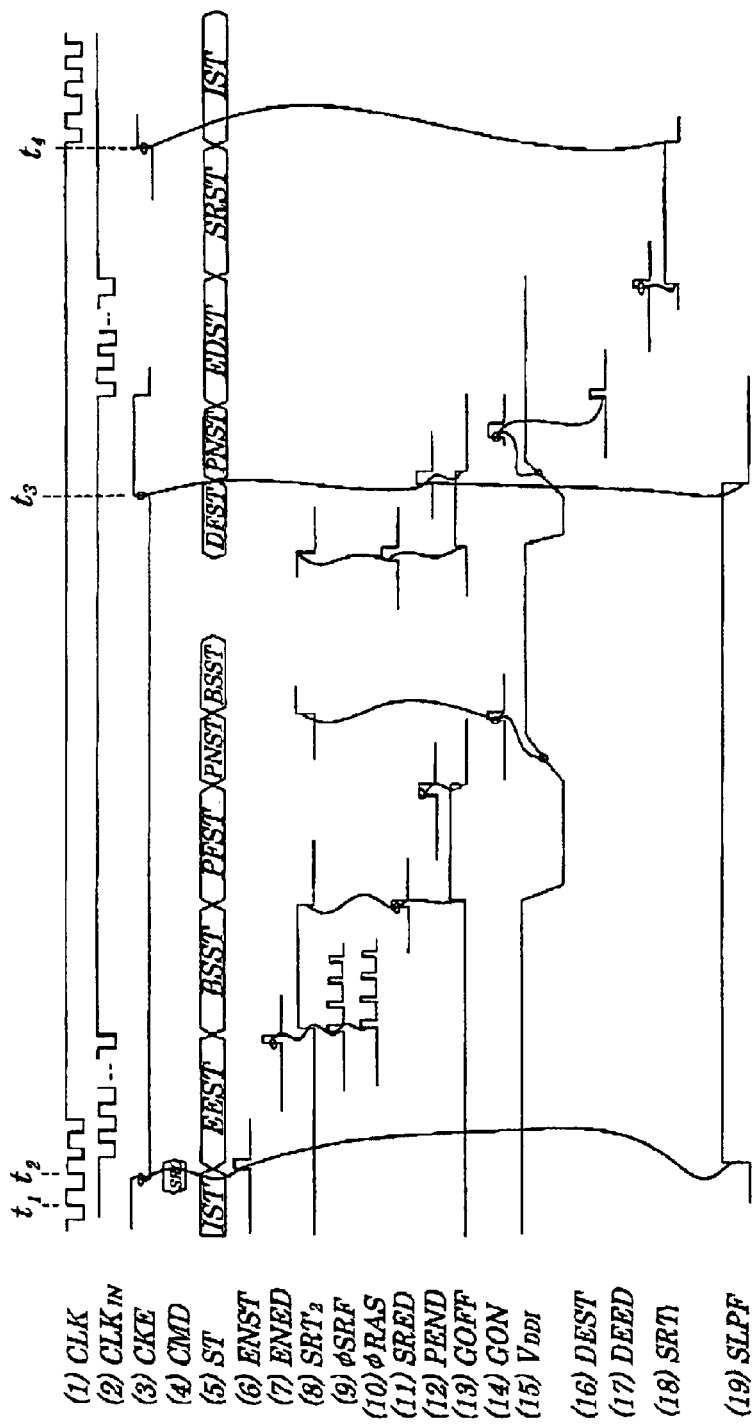
FIG. 5 is a timing chart explaining internal operations performed when the ultra-low power consumption mode exits in a power-OFF state after the semiconductor storage device has been put in the ultra-low power consumption mode according to the embodiment of the present invention.
Figure 6:
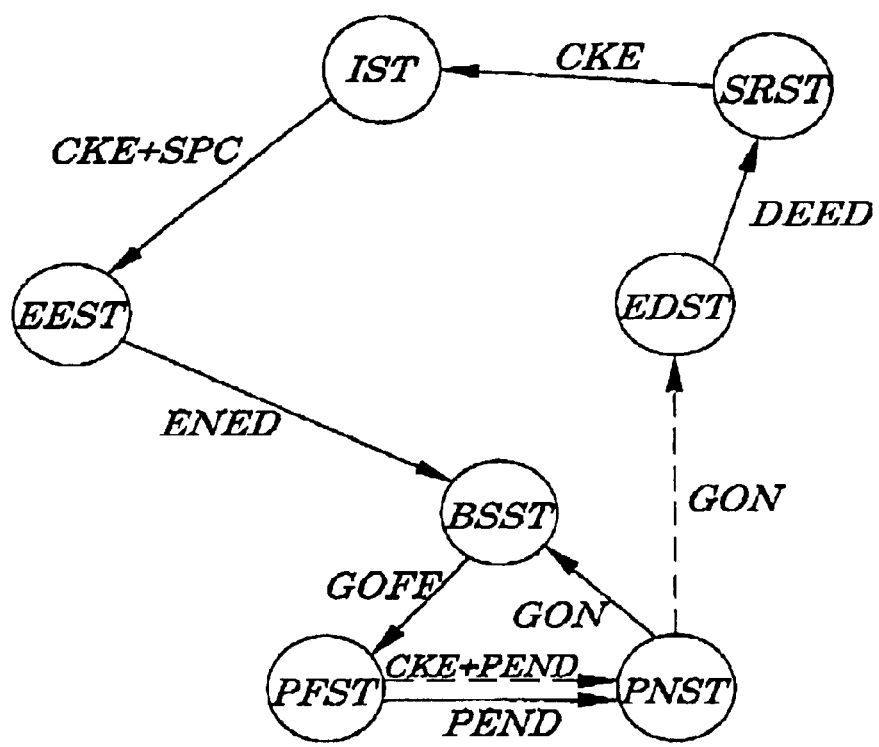
FIG. 6 is a state transition diagram explaining internal operations performed when the ultra-low power consumption mode exits in the power-OFF state after the semiconductor storage device has been put in the ultra-low power consumption mode according to the embodiment of the present invention.

(2) Case in which, after the semiconductor storage device has been set to the ultra-low power consumption mode, the ultra-low power consumption mode exits in a state of the power-OFF state PFST (see FIG. 5 and FIG. 6).

First, in the semiconductor storage device of the embodiment, after it is put in the ultra-low power consumption mode by a command SPC fed when the clock enable signal CKE is changed from its high to low level, its internal state ST is changed sequentially from its idle state IST through its ECC encode state EEST, burst self-refresh state BSST, power-OFF state PFST, and to power-ON state PNST, and then repeatedly from its power-ON state to its burst self-refresh state BSST, from its burst self-refresh state BSST to its power-OFF state PFST, and from its power-OFF state PFST to its power-ON state PNST as shown in FIG. 6, which is the same as described in the above item (1) case and their description is omitted accordingly.

Next, let it be assumed that, as shown in FIG. 5(3), at the time $t_3$ when the internal state ST of the semiconductor storage device of the embodiment is the power-OFF state PFST, in order to exit the ultra-low power consumption mode, the clock enable signal CKE is changed from its low to high level. The self-mode decoder 32, in response to a change of the clock enable signal CKE from its low to high level, resets the ultra-low power consumption flag and, at the same time, the ECC mode decoder 31, as shown in FIG. 5(19), resets the ultra-low power consumption flag SLPF. As a result, the timer 26, since it is measuring the internal power source off time, in response to resetting of the ultra-low power consumption flag SLPF, stops measurements of the internal power source off time and feeds a high-level "internal power source OFF signal" PEND shown in FIG. 5(6) to the self-refresh circuit 22. Therefore, the self-refresh circuit 22, based on the high-level "internal power source OFF signal" PEND, in order to activate the internal power source circuit 27, as shown in FIG. 5(13), changes the "internal power source OFF signal" GOFF from its high to low level and feeds it to the internal power source circuit 27.

This causes the internal state ST of the semiconductor storage device of the embodiment to be changed, as shown by broken lines in FIG. 5(5) and FIG. 6, from its power-OFF state PFST to its power-ON state PNST. That is, the internal power source circuit 27, since an "internal power source OFF signal" GOFF changes from its high to low level, as shown in FIG. 5(15), starts a supply of an internal voltage to each component of the semiconductor storage device. Then, the internal power source circuit 27, when having detected that a potential being monitored has reached a potential having a specified value, feeds the high-level "internal power source ON signal" GON shown in FIG. 5(14) to the ECC mode decoder 31 and to the self-mode decoder 32. Thus, though the "internal power source ON signal" GON has been changed from its low to high level, since the ultra-low power consumption flag has been reset, the self-mode decoder 32, as shown in FIG. 5(8), does not produce a high-level second self-refresh start signal $SRT_2$. On the other hand, since the "internal power source ON signal" GON has changed from its low to high level and the ultra-low power consumption flag SLPF has been reset, the ECC mode decoder 31 produces a high-level decode start signal DEST and feeds it to the ECC controller 23 and sets a decode flag.

This causes an internal state ST of the semiconductor storage device of the embodiment to be changed, as shown by broken lines in FIG. 5(5) and in FIG. 6, from its power-ON state PNST to its ECC decode state EDST. The internal state ST of the semiconductor storage device thereafter, as in the above item (1) case, after having been changed from its ECC decode state EDST to its self-refresh state SRST, for example, at the time $t_4$, as shown in FIG. 5(3), when the clock enable signal CKE is changed from its low to high level, is changed to its idle state IST.

Figure 7:
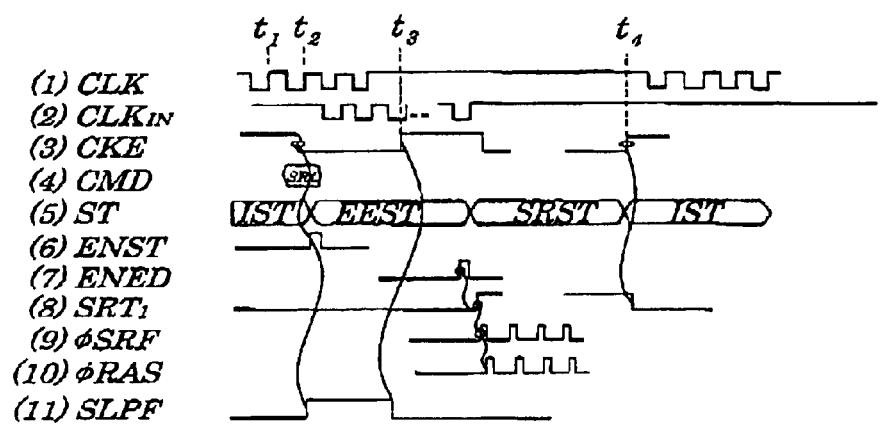
FIG. 7 is a timing chart explaining internal operations performed when the ultra-low power consumption mode exits in an EEC-encoding state after the semiconductor storage device has been put in the ultra-low power consumption mode according to the embodiment of the present invention.
Figure 8:
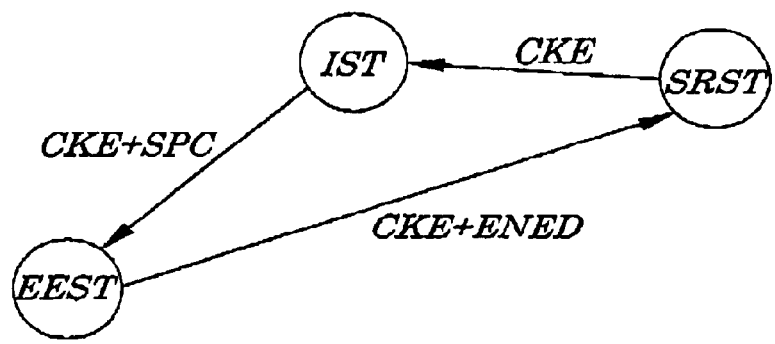
FIG. 8 is a state transition diagram for explaining internal operations performed when the ultra-low power consumption mode exits in the EEC encoding state after the semiconductor storage device has been put in the ultra-low power consumption mode according to the embodiment of the present invention.

(3) Case in which, after the semiconductor storage device has been put in the ultra-low power consumption mode, the ultra-low power consumption mode exits in a state of the ECC encode state EEST (see FIGS. 7 and 8).

First, in the semiconductor storage device of the embodiment, after it is put in the ultra-low power consumption mode by a command SPC fed when the clock enable signal CKE is changed from its high to low level, its internal state ST is changed from its idle state IST to its ECC encode state EEST, as shown in FIG. 8, which is the same as described in the above item (1) case and their descriptions are omitted accordingly.

Next, let it be assumed that, as shown in FIG. 7(3), at the time $t_3$ when the internal state ST of the semiconductor storage device of the embodiment is the ECC encode state EEST, in order to exit the ultra-low power consumption mode, the clock enable signal CKE is changed from its low to high level. In response to a change of the clock enable signal CKE from its low to high level, the self-mode decoder 32 resets the ultra-low power consumption flag and, at the same time, the ECC mode decoder 31, as shown in FIG. 7(9), resets the ultra-low power consumption flag SLPF. Then, the ECC controller 23, when parity calculation to be performed on all memory cells making up each of memory cells $11_1$ to $11_4$ and writing of a parity region into each of the memory cells are terminated in the ECC 24, feeds an encode terminating signal ENED shown in FIG. 7(7) to the ECC mode decoder 31 and to the self-mode decoder 32. Therefore, the ECC mode decoder 31, when the encode terminating signal ENED is fed from the ECC controller 23, resets the encode flag. On the other hand, the self-mode decoder 32, since the ultra-low power consumption flag is reset when the encode terminating signal ENED is fed from the ECC controller 23, produces a high-level first self-refresh start signal $SRT_1$ shown in FIG. 7(8) and feeds it to the self-refresh circuit 22 and to the OR gate 28.

This causes the internal state ST of the semiconductor storage device of the embodiment to be changed from its ECC encode state EEST to its self-refresh state SRST. The internal state ST of the semiconductor storage device thereafter, as in the above item (1) case, after having been changed from its ECC decode state EDST to its self-refresh state SRST, at the time $t_4$, for example, as shown in FIG. 7(3), when the clock enable signal CKE is changed from its low to high level, is changed to its idle state IST.

(4) Case in which, after the semiconductor storage device has been put in the ultra-low power consumption mode, the ultra-low power consumption mode exits in a state of the power-ON state PNST.

First, in the semiconductor storage device of the embodiment, after it is put in the ultra-low power consumption mode by a command SPC fed when the clock enable signal CKE is changed from its high to low level, its internal state ST is changed sequentially from its idle state IST through its ECC encode state EEST, burst self-refresh state BSST, power-OFF state PFST, and to power-ON state PNST, and then repeatedly from its power-ON state to its burst self-refresh state BSST, from its burst self-refresh state BSST to its power-OFF state PFST, and from its power-OFF state PFST to its power-ON state PNST, which is the same as described in the above item (1) case and their descriptions are omitted accordingly.

Next, let it be assumed that, at the time when the internal state ST of the semiconductor storage device of the embodiment is the power-ON state PNST, in order to exit the ultra-low power consumption mode, the clock enable signal CKE is changed from its low to high level. In this case, the internal state ST of the semiconductor storage device, after having been changed to the power-ON state PNST, is sequentially changed to a one-time burst self-refresh state BSST, ECC encode state EEST, and self-refresh state SRST and, thereafter, as in the above item (1) case, when the clock enable signal CKE is changed from its low to high level at a time, to the idle state IST.

Next, an external specification of the semiconductor storage device of the embodiment will be explained by referring to a timing chart shown in FIGS. 9 and 10. The diagonally shaded areas in FIGS. 9 and 10 show that either of a high level or a low level of a signal can be used for operations.

(A) External Specifications in Ultra-low Power Consumption Mode

Figure 9:
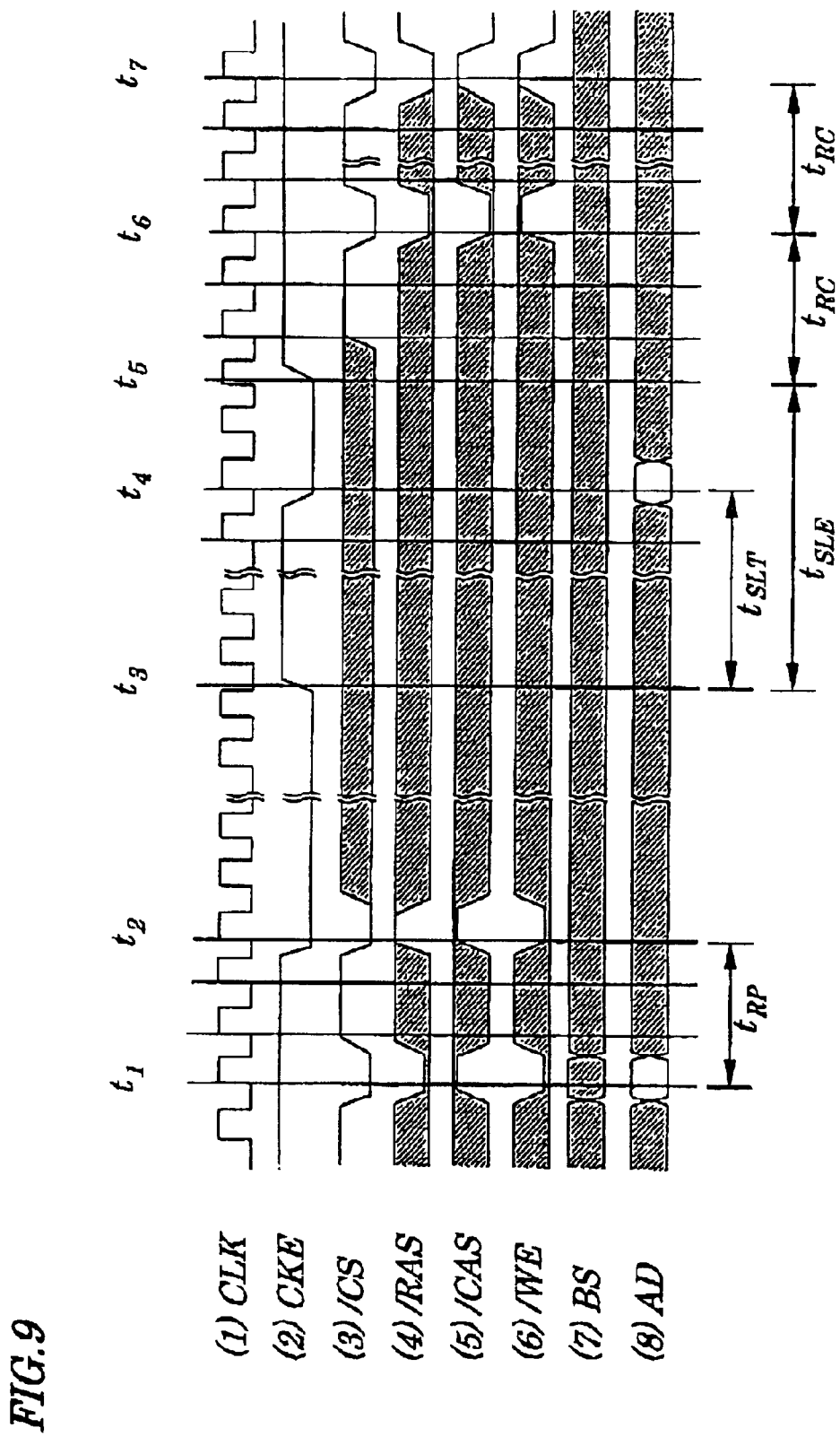
FIG. 9 is a timing chart for explaining an external specification of the ultra-low power consumption mode of the semiconductor storage device according to the embodiment of the present invention.
Figure 10:
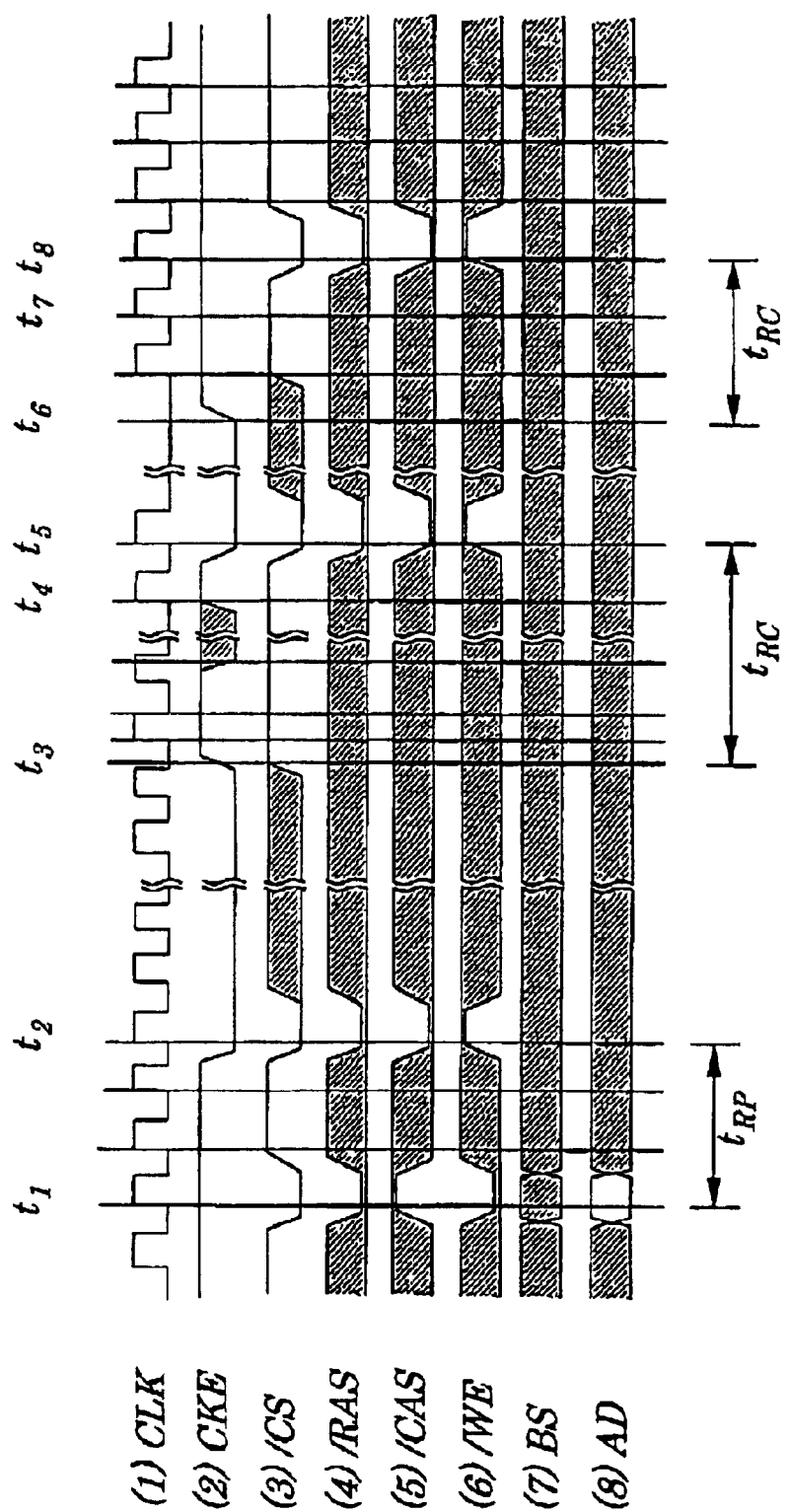
FIG. 10 is a timing chart for explaining an external specification of an ordinary self-refresh mode of the semiconductor storage device according to the embodiment of the present invention.

First, in synchronization with a rise of a clock CLK shown in FIG. 9(1), in order shown sequentially in FIG. 9(3) to FIG. 9(8), a low-level chip select signal/CS, low-level row address strobe signal/RAS, high-level column address strobe signal/CAS, low-level write enable signal/WE, bank selection signal BS used to select any specified one out of banks $1_1$ to $1_4$, and address AD are provided at the time $t_1$. The low-level chip select signal/CS, low-level row address strobe signal/RAS, high-level column address strobe signal/CAS, and low-level write enable signal/WE represent a command PCC used to issue an instruction so that each of input and output lines being formed on each of memory cell arrays $1_1$ to $1_4$ is put in a pre-charged state. Here, the pre-charged state denotes a state in which writing of data from an external and reading of data to the external are made possible in each of memory cells mounted each corresponding to each of the input and output lines.

Next, at the time $t_2$ after pre-charged time $t_{RP}$ or more predetermined according to the specification has elapsed following the time $t_1$, in synchronization with a rise of the clock CLK, the clock enable signal CKE shown in FIG. 9(2) is changed from its high to low level and the low-level chip select signal/CS, high-level row address strobe signal/RAS, high-level column address strobe signal/CAS, and low-level write enable signal/WE are provided in order shown in FIG. 9(3) to FIG. 9 (6). The low-level chip select signal/CS, high-level row address strobe signal/RAS, high-level column address strobe signal/CAS, and low-level write enable signal/WE represent a command SPC used to make an instruction for setting of the ultra-low power consumption mode. This causes the semiconductor storage device of the embodiment to be put in the ultra-low power consumption mode and to initiate internal operations described in a first half of the above item (1). Here, a supply of the command PCC, bank selection signal BS, and address AD is not always required, however, it is necessary that such the command PCC, bank selecting signal BS, and address AD are fed earlier by time $t_{RP}$ before the supply of the command SPC and the internal state has to completely be its idle state at a time of the supply of the command SPC.

Then, in order to exit the ultra-low power consumption mode, for example, at the time $t_3$, the clock enable signal CKE shown in FIG. 9(2) is changed from its low to high level. As a result, the semiconductor storage device of the embodiment, depending on an internal state occurring at the time when the clock enable signal CKE has changed from its low to high level and according to procedures described in the above items (1) to (4), starts exiting the ultra-low power consumption mode. Next, after having changed the clock enable signal CKE from its low to high level, before a predetermined time $t_{SLT}$ elapses, for example, at the time $t_4$, the clock enable signal CKE shown in FIG. 9(2) is changed from its high to low level and the address AD shown in FIG. 9(8) is fed. A reason why this process is performed is as follows. That is, as described later, in order to change the internal state of the semiconductor storage device of the embodiment from its self-refresh state SRST to its idle state IST, it is necessary that, at the time $t_5$, the clock enable signal CKE is changed from its low to high level, however, before this change, the clock enable signal CKE has to be changed from its low to high level without fail. However, a supply of the address AD is not always necessary.

Next, at the time $t_5$ after the predetermined time $t_{SLE}$ has elapsed following the time $t_4$, the clock enable signal CKE shown in FIG. 9(2) is changed from its low to high level. This causes the internal state of the semiconductor storage device to be changed from its self-refresh state SRST to its idle state IST according to procedures described in the above items (1) to (4). Here, the time $t_{SLE}$ is, as described in the above item (1), maximum time or more required for correction of errors caused by dispersion of the internal clock $CLK_{IN}$ which is predetermined as its external specification when considerations are given to the dispersion of the above internal clock $CLK_{IN}$.

Next, at the time $t_6$ after the predetermined time $t_{RC}$ has elapsed following the time $t_5$, in order shown in FIG. 9(3) to FIG. 9(6), the low-level chip select signal/CS, low-level row address strobe signal/RAS, low level column address strobe signal/CAS, and high-level write enable signal/WE are provided. The low-level chip select signal/CS, low-level row address strobe signal/RAS, low-level column address strobe signal/CAS, and high-level write enable signal/WE represent a command ORC used to issue an instruction for auto-refresh operations. Here, the auto-refresh operation is performed in a one-shot operation designating a refresh address by using the refresh counter 9. Moreover, if necessary, at the time $t_7$ after the predetermined time $t_{RC}$ has elapsed following the time $t_6$, to activate each of banks $1_1$ to $1_4$, in order shown in FIG. 9(3) to FIG. 9(6), the low-level chip select signal/CS, low-level row address strobe signal/RAS, high-level column address strobe signal/CAS, and high-level write enable signal/WE are provided. The low-level chip select signal/CS, low-level row address strobe signal/RAS, high-level column address strobe signal/CAS, and high-level write enable signal/WE represent a command BAC used to activate each of banks $1_1$ to $1_4$.

(B) External Specifications of Ordinary Self-refresh Process

First, at the time $t_1$, in synchronization with a rise of the clock CLK shown in FIG. 10(1), in order shown in FIG. 10(3) to FIG. 10(1), the low-level chip select signal/CS, low-level row address strobe signal/RAS, high-level column address strobe signal/CAS, and low-level write enable signal/WE, bank selection signal BS, and address AD are fed. The low-level chip select signal/CS, low-level row address strobe signal/RAS, high-level column address strobe signal/CAS, and low-level write enable signal/WE represent a command PCC described above.

Next, at the time $t_2$ after the predetermined time $t_{RP}$ has elapsed following the time $t_1$, in order shown in FIG. 10(2), in synchronization with a clock CLK shown in FIG. 10(1), the clock enable signal CKE is changed from its high to low level and, in order shown in FIG. 10(3) to FIG. 10(6), the low level chip select signal/CS, low-level row address strobe signal/RAS, low-level column address strobe signal/CA, and high-level write enable signal/WE are fed. The low-level chip select signal/CS, low-level row address strobe signal/RAS, low-level column address strobe signal/CAS, and high-level write enable signal/WE represent a command SRC used to issue an instruction for setting of an ordinary self-refresh mode. This causes the semiconductor storage device of the embodiment to be put in the ordinary self-refresh mode. Though a supply of the command PCC, bank selection signal BS, and address AD at the time $t_1$ is not always necessary, when these signals are fed, they have to be fed by the time $t_{RF}$ before a supply of the command SRC and the internal state of the semiconductor storage device has to be changed to a full idle state IST at the time of the supply of the command SRC. Then, to exit the ordinary self-refresh mode, for example, at a time $t_3$, the clock enable signal CKE shown in FIG. 10(2) is changed from its low to high level. This causes the semiconductor storage device of the embodiment to start exiting the ordinary self-refresh mode.

Next, to again put the semiconductor storage device into the ordinary self-refresh mode, at the time $t_5$ when the clock CLK arrives after the time $t_4$, when the clock CLK (see FIG. 10(1)) rises immediately before the lapse of the predetermined time $t_{RC}$ following the time $t_3$, in synchronization with a rise of the clock CLK, the clock enable signal CKE is changed from its high to low level and in order shown in FIG. 10(3) to FIG. 10(6), the low level chip select signal/CS, low level row address strobe signal/RAS, low-level column address strobe signal/CAS, and high-level write enable signal/WE are fed. This causes the semiconductor storage device of the embodiment to be put into the ordinary self-refresh mode. Then, to again exit the ordinary self-refresh mode, for example, at the time $t_6$, the clock enable signal CKK shown in FIG. 10(2) is changed from its low to high level. This causes the semiconductor storage device of the embodiment to start exiting the ordinary self-refresh mode.

Thereafter, to perform auto-refresh operations, at the time $t_7$ when the clock CLK arriving after the time $t_7$ when the clock CLK (see FIG. 10(1)) rises immediately before the lapse of the predetermined time $t_{RC}$ following the time $t_6$, rises and, in order shown in FIG. 10(3) to FIG. 10(6), the low-level chip select signal/CS, low-level row address strobe signal/RAS, low-level column address strobe signal/CA, and high-level write enable signal/WE, all of which represent a command ORC to issue an instruction for auto-refresh operations, are fed.

Thus, according to the semiconductor storage device of the embodiment, by putting an internal state of the semiconductor storage device into a state obtained by combining a state in an ultra-low power consumption mode in which an ECC encoder state EEST, burst self-refresh state BSST, power-OFF state PFST, power-ON state PNST, and ECC decode state EDST with an ordinary self-refresh state SRST are operated, a great reduction in power consumption in a standby state can be achieved.

Figure 11:
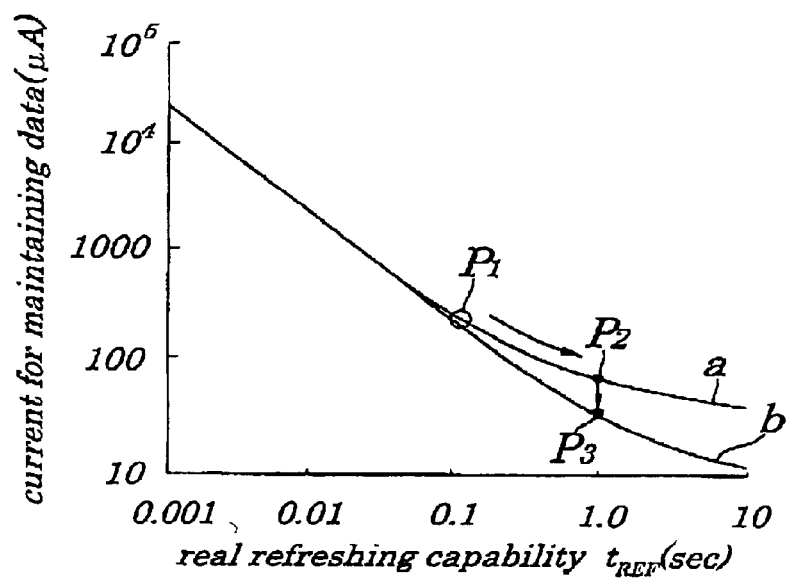
FIG. 11 is a graph for explaining an effect obtained by the method for controlling power for the semiconductor storage device of the embodiment of the present invention.

Here, effects of the power control employed in the semiconductor storage device of the embodiment will be described by referring to FIG. 11. In FIG. 11, a curve "a" represents a curve of a characteristic of a current for maintaining data to a real refreshing capability $t_{REF}$ in a case where a direct current is 50 μA in the semiconductor storage device, while a curve "b" represents a curve of a characteristic of a current for maintaining data to a real refreshing capability $t_{REF}$ in a case where an average amount of the direct current is 10 μA in the semiconductor storage device of the embodiment. Since a real refreshing capability $t_{REF}$ of the semiconductor storage device of the embodiment is 64 msec, if any power controlling method is not employed, an amount of a current for maintaining data is about 200 μA as shown by point $P_1$ in FIG. 11. Then, since the semiconductor storage device is put in the ECC encode state and ECC decode state EDST, the apparent refreshing time is extended to its maximum level that can be assured by the characteristic and, since an amount of an alternating current is reduced, the apparent refreshing capability $t_{REF}$, as shown in FIG. 11, is extended from the level at the point $P_1$ to point $P_2$ and an amount of the data maintaining current can be reduced to about 70 μA. Moreover, since the semiconductor storage device is put into the power-OFF state PFST, an amount of the direct current is reduced and, as a result, the data maintaining current is reduced from an amount of the current at the point $P_2$ to that at the point $P_3$ being about 200 μA. The power controlling method employed in the semiconductor storage device of the embodiment can provide a greatest effect in portable electronic devices such as a portable cellular phone, PHS, or a like which is adapted to return to an ordinary operation state by a receipt of a signal when it is turned ON and while it is in a state waiting for an incoming signal from external.

It is apparent that the present invention is not limited to the above embodiments but may be changed and modified without departing from the scope and spirit of the invention. For example, in the above embodiment, the clock CLK, internal clock $CLK_{IN}$, and clock enable signal CKE are active high and the chip select signal/CS, row address strobe signal/RAS, column address strobe signal/CAS and write enable signal/WE are active low, however, all signals maybe active high or low, or the clock CLK, internal clock $CLK_{IN}$, row address strobe signal/RAS, column address strobe signal/CAS and write enable signal/WE may be active high. Moreover, in the above embodiment, in the internal operations described in the above items (1) to (4), in order to exit the ultra-low power consumption mode, when the clock enable signal CKE is changed from its low to high level, the internal state, after having been changed automatically to the self-refresh state SRST without fail, is changed to its idle state IST. However, the present invention is not limited to this. That is, the semiconductor storage device may be configured so that, it is put, after its operation is set once to the ordinary self-refresh mode and then the self-refresh mode exits, into the idle state IST, however, the semiconductor storage device may be so configured that, by feeding a command SRC from an external, after having put the semiconductor storage device once into an ordinary self-refresh mode, the ordinary self-refresh mode exits and transition to its idle state IST occurs.

Also, in the above embodiment, the ECC mode decoder 31 and the self-mode decoder 32 are judged to have been put into the ultra-low power consumption mode or ordinary self-refresh mode when such the combined signals as shown in FIG. 9(3) to FIG. 9(6) and in FIG. 10(3) to FIG. 10(6) are provided, however, types of signals or combinations of signals provided to the ECC mode decoder 31 and the self-decoder 32 may be arbitrary. Examples of the above include address signals, data signals, signals obtained by combining these signals with the above row address strobe signal/RAS, or a like. That is, signals to be fed to the ECC decoder 31 and self-mode decoder 32, so long as they are different from noises and intentional signals, may be arbitrary.

Figure 12:
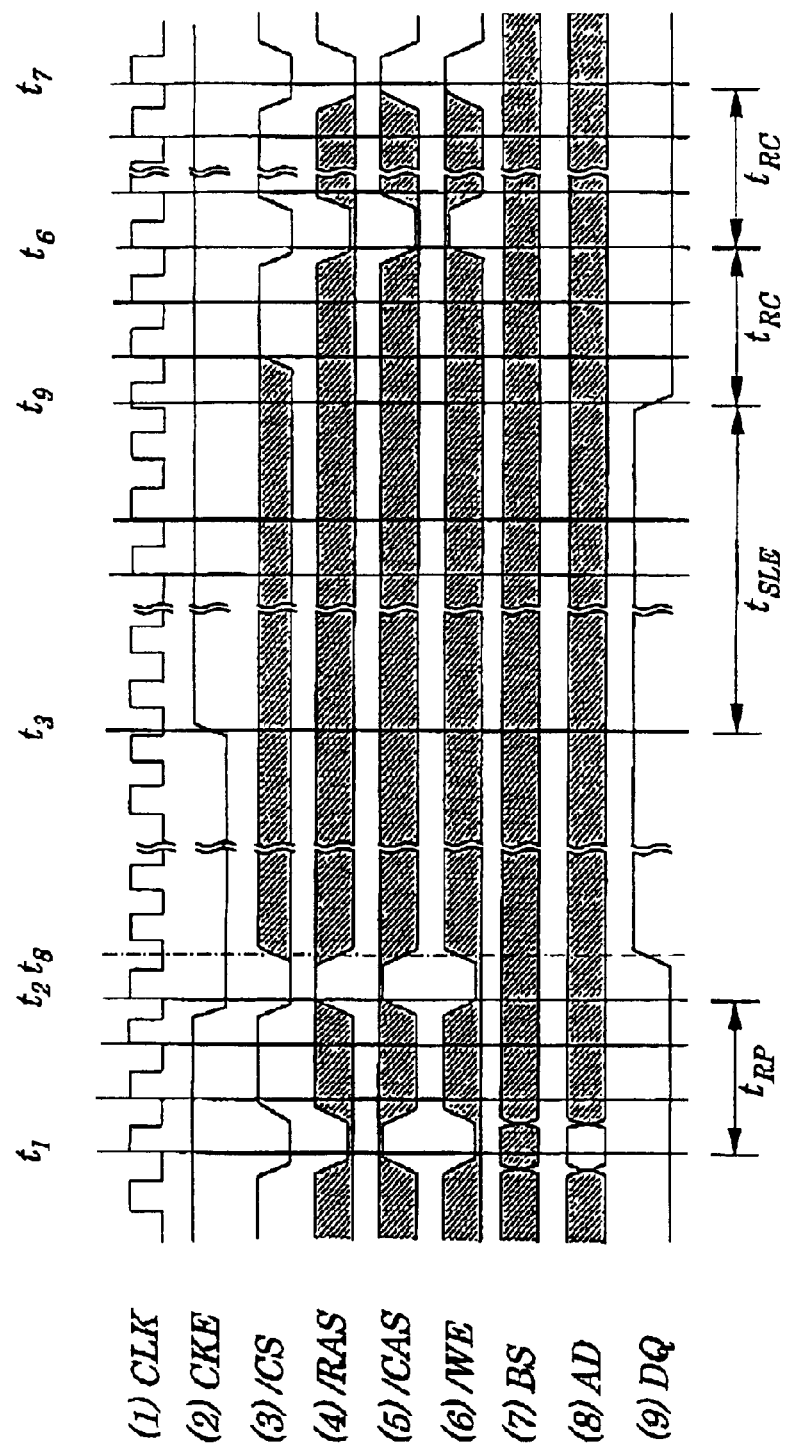
FIG. 12 is a timing chart explaining an external specification for an ultra-low power consumption mode in the semiconductor storage device in a modified embodiment of the present invention.

Also, in the above embodiment, information about the internal state ST of the semiconductor storage device cannot be obtained, however, the semiconductor storage device may be so configured that a state signal being set to be high in the ultra-low power consumption mode is output from the input/output terminal DQ shown in FIG. 1. FIG. 12 is a timing chart showing external specifications of the semiconductor storage device employed when the above state signal is output. In FIG. 12, descriptions of portions having same waveforms or providing same timing as in each of components in FIG. 9 are omitted. In this configuration, when the internal state of the semiconductor storage device is set to be the ultra-low power consumption mode, as shown in FIG. 12(9), a high-level state signal is output from the data input/output terminal DQ. Therefore, by using this state signal, a user can get information as to whether the internal state of the semiconductor storage device is set to its ultra-low power consumption mode. Therefore, a user, in order to exit the ultra-low power consumption mode, after having changed the clock enable signal CKE shown in FIG. 12(2) from its low to high level, by detecting that the state signal shown in FIG. 12(9) has changed from its high to low level, for example, at the time $t_9$, may feed a command ORC used to issue an instruction for an auto-refresh process at the time $t_6$ or a command BAC used to activate each of banks $1_1$ to $1_4$ at the time $t_7$. On the other hand, the semiconductor storage device, in response to a change of the clock enable signal CKE shown in FIG. 12(2) from its low to high level at the time $t_3$, after having charged its internal state ST to the ECC decode operation state EDST, puts the data input/output terminal DQ having output the state signal into a high impedance state. According to configurations described above, the user, after having exited the ultra-low power consumption mode, can use straight the semiconductor storage device without changing the internal state ST of the semiconductor storage device to the self-refresh state SRST. Moreover, the semiconductor storage device may be so constructed that the state signal can be output to an external with an exclusive pin.

Also, in the above embodiment, the ECC 24 operates in synchronization with the internal clock $CLK_{IN}$, however, it may be so constructed as to operate in synchronization with the clock CLK. Moreover, in the configuration described above, by obtaining information about a number of cycles required for the error correcting process in the ECC 24, exact information as to whether or not the above error correcting process has terminated can be gotten from an external and, as a result, the user can use the semiconductor storage device immediately after the above error correcting process has been completed.

Also, in the above embodiment, the burst refresh process is performed while the semiconductor storage device is put in its burst self-refresh state BSST, however, the refresh process may be performed in the same refresh period $T_R$ as employed for an ordinary self-refresh process. In this case, the internal power source off time becomes shorter when compared with the embodiment and effects of reducing a direct current become smaller, however, since one type of the refresh period $T_R$ can be used, it is possible to simplify configurations of the semiconductor storage device.

Also, in the above embodiment, after the ultra-low power source mode has been set, the internal state of the semiconductor storage device is first changed to its ECC encode state EEST and then sequentially through its burst self-refresh state BSST and power-OFF state PFST, then to power-ON state PNST, however, the present invention is not limited to the above. That is, the semiconductor storage device may be so constructed that, after the ultra-low power source mode has been set, its internal state is first changed to its ECC encode state EEST and then sequentially through its power-OFF state PFST, burst self-refresh state BSST, power-ON state PNST, and to its burst self-refresh state BSST and, thereafter, until the ultra-low power consumption mode exits, transition from its burst self-refresh state to its power-OFF state, from its power-OFF state to its power-ON state, from its power-ON state to its burst self-refresh state may be repeated. Since the refresh process is performed substantially in the ECC encode state EEST, even if transition from the ECC encode state EEST to the power-OFF state PFST occurs, data being stored in the memory cell is not destroyed.

Also, in the above embodiment, in the ultra-low power consumption mode, the ECC encode state EEST, burst self-refresh state BSST, power-OFF state PFST, power-ON state PNST, and ECC decode state EDST are provided. However, the present invention is not limited to this. For example, in the semiconductor storage device having some large real refreshing capability $t_{REF}$, it may be so constructed that, in the ultra-low power consumption mode, the burst self-refresh state BSST, power-OFF state PFST, and power-ON state PNST are provided. In this case, when the semiconductor storage device is put in the ultra-low power consumption mode, transition of its internal state from its idle state IST to its burst self-refresh state BSST occurs and then transition from its burst self-refresh state BSST to its power-OFF state PFST, from its power-OFF state PFST to its power-ON PNST, and from its power-ON state PNST to its burst self-refresh state BSST is repeated thereafter. Moreover, the above semiconductor storage device may be so constructed that setting of and exiting from the above ultra-low power consumption mode is achieved by employing the same way of the setting and exiting as provided in the above embodiment or by mounting a register adapted to select either of the above low power consumption mode or the ordinary self-refresh mode inside of the command decoder 21 and by selecting either of the modes depending on a value of the register. Also, a method for transition according to the internal state ST of the semiconductor storage device to be employed when an instruction for exiting is provided may be the same as in the above embodiment except that the ECC encode state EEST and ECC decode state EDST do not exist. That is, if the semiconductor storage device is in the burst self-refresh state BSST when the ultra-low power consumption mode exits, transition to the self-refresh state SRST occurs. On the other hand, the semiconductor storage device is in the power-OFF state PFST when the ultra-low power consumption mode exits, transition to the power-ON state PNST occurs and then transition to the self-refresh state SRST occurs.

What is claimed is:

1. A method for controlling power for a semiconductor storage device having a memory cell which must be refreshed to maintain data, comprising:

a step of employing an ultra-low power consumption mode in which power control is exerted in a standby state and in which a centralized refresh state, power-OFF state, and power-ON state are provided, and wherein said memory cell is refreshed in a centralized manner in said centralized refresh state, an internal power source circuit is partially turned OFF in said power-OFF state, and said internal power source circuit having been partially turned OFF is turned ON in said power-ON state.

2. The method for controlling power for said semiconductor storage device according to claim 1, wherein, in said ultra-low power consumption mode, an error correcting circuit encode state and an error correcting circuit decode state are provided and wherein, in said error correcting circuit encode state, an arithmetic operation is performed on parity bits by said error correcting circuit to restore said memory cell whose maintaining characteristics are deteriorated and wherein, in said error correcting encode state, an error correction is made by said error correcting circuit based on results from said arithmetic operations.

3. The method for controlling power for said semiconductor storage device according to claim 2, wherein said error correcting circuit operates in synchronization with a clock produced internally or fed from an external.

4. The method for controlling power for the semiconductor according to claim 2, wherein, when instructions for said semiconductor storage device to be put in said ultra-low power consumption mode are provided, transition to said error correcting circuit encode state and to said centralized refresh state sequentially occur and, until instructions for exiting said ultra-low power consumption mode are provided, transition from said centralized refresh state to said power-OFF state, from said power-OFF state to said power-ON state, and from said power-ON state to said centralized refresh state are repeated.

5. The method for controlling power for the semiconductor storage device according to claim 2, wherein, when instructions for said semiconductor storage device to be put in said ultra-low power consumption mode are provided, transition to said error correcting encode state, to said power-OFF state, and to said centralized refresh state sequentially occurs and, until instructions for exiting said ultra-low power consumption mode are provided, transition from said centralized refresh state to said power-OFF state, from said power-OFF state to said power-ON state, and from said power-ON state to said centralized refresh state are repeated.

6. The method for controlling power for the semiconductor storage device according to claim 2, wherein, in said ultra-low power consumption mode, if said semiconductor storage device is put in said centralized refresh state when said ultra-low power consumption mode exits, transition to said error correcting circuit decode state occurs and then transition occurs to a self-refresh state in which said memory cell is refreshed in a period corresponding to a maintaining characteristic of said memory cell.

7. The method for controlling power for the semiconductor storage device according to claim 2, wherein, in said ultra-low power consumption mode, if said semiconductor storage device is put in said power-OFF state when instructions for exiting said ultra-low power consumption mode are provided, transition to said power-ON state and to said error correcting circuit decode state sequentially occurs and then transition occurs to a self-refresh state in which said memory cell is refreshed in a period corresponding to a maintaining characteristic of said memory cell.

8. The method for controlling power for the semiconductor storage device according to claim 2, wherein, in said ultra-low power consumption mode, if said semiconductor storage device is put in said error correcting circuit encode state when instructions for exiting said ultra-low power consumption mode are provided, after termination of said error correcting circuit encode state, transition occurs to a self-refresh state in which said memory cell is refreshed in a period corresponding to a maintaining characteristic of said memory cell.

9. The method for controlling power for the semiconductor storage device according to claim 1, wherein a state signal indicating that said semiconductor storage device is internally put in said ultra-low power consumption mode is output to an external.

10. The method for controlling power for the semiconductor storage device according to claim 1, wherein said semiconductor storage device is configured to operate in a self-refresh mode such that said memory cell is periodically and automatically refreshed.

11. The method for controlling power for the semiconductor storage device according to claim 1, wherein, in said centralized refresh state, said refresh process is performed on said memory cell in a period being shorter than that being corresponded to a maintaining characteristic of said memory cell.

12. The method for controlling power for the semiconductor storage device according to claim 1, wherein, in said power-OFF state, all power sources other than paired poles in said internal power source circuit are turned OFF.

13. The method for controlling power for the semiconductor storage device according to claim 1, wherein, in said power-OFF state, leak paths of peripheral circuits of a memory cell array made up of a plurality of said memory cells are interrupted.

14. The method for controlling power for the semiconductor storage device according to claim 1, wherein transition to said centralized refresh state occurs when instructions for said semiconductor storage device to be put in said ultra-low power consumption mode are provided and then transition from said centralized refresh state to said power-OFF state, from said power-OFF state to said power-ON state, and from said power-ON state to said centralized state are repeated.

15. The method for controlling power for the semiconductor according to claim 1, wherein, in said ultra-low power consumption mode, if said semiconductor storage device is put in said centralized refresh state when instructions for exiting of said ultra-low power consumption mode are provided, transition occurs to a self-refresh state in which said memory cell is refreshed in a period corresponding to a maintaining characteristic of said memory cell.

16. The method for controlling power for the semiconductor according to claim 1, wherein, in said ultra-low power consumption mode, if said semiconductor storage device is put in said power-OFF state when instructions for exiting said ultra-low power consumption mode are provided, transition occurs to a self-refresh state in which said memory cell is refreshed in a period corresponding to a maintaining characteristic of said memory cell.

17. The method for controlling power for the semiconductor storage device according to claim 1, wherein instructions are provided to put said semiconductor storage device into said ultra-low power consumption mode by a first change occurring in a specified signal fed from an external and to exit said ultra-low power consumption mode by a second change occurring in said specified signal.

18. The method for controlling power for the semiconductor storage device according to claim 17, wherein, after instructions have been provided for exiting said ultra-low power consumption mode, instructions are provided for transition of an internal state of said semiconductor storage device to an idle state where no operation is performed again by said second change occurring in said specified signal.

19. The method for controlling power for the semiconductor storage device according to claim 18, wherein, after having said specified signal produce said second change in order to give instructions for exiting said ultra-low power consumption mode, when maximum time or more required for error corrections in said error correcting circuit decode state has elapsed, said second change is produced in said specified signal used to give instructions for exiting an internal state of said semiconductor storage device to said idle state.

20. A semiconductor storage device having a memory cell which must be refreshed to maintain data, comprising:
 a self-refresh executing unit to refresh said memory cell;
 an internal power source circuit to provide power to each of components; and
 a controller, when instructions are provided for operations in an ultra-low power consumption mode in order to exert power control in a standby state, to have said self-refresh executing unit execute refresh operations in a centralized refresh state in which a centralized refresh process is performed on said memory cell, in a power-OFF state in which said internal power source circuit is partially turned OFF, and in a power-ON state in which said internal power source circuit having been partially turned OFF is turned ON.

21. The semiconductor storage device according to claim 20, further comprising an error correcting circuit used to perform arithmetic operations on parity bits to restore said memory cell whose maintaining characteristics are deteriorated and to make error corrections based on results from said arithmetic operations and wherein said controller executes operations in an error correcting circuit encode state to have said error correcting circuit perform said arithmetic operations and in an error correcting circuit decode state to have said error correcting circuit make said error correction.

22. The semiconductor storage device according to claim 21, wherein said error correcting circuit operates in synchronization with a clock occurring internally or being fed from an external.

23. The semiconductor storage device according to claim 21, wherein said controller, when instructions for operations in said ultra-low power consumption are provided, sequentially changes an internal state of said semiconductor storage device to said error correcting circuit encode state and to said centralized refresh state and, until instructions for exiting said ultra-low power consumption are provided, repeats transition from said centralized refresh state to said power-OFF state, from said power-OFF state to said power-ON state, and from said power-ON state to said centralized refresh state.

24. The semiconductor storage device according to claim 21, wherein said controller, when instructions for operations in said ultra-low power consumption are provided, sequentially changes an internal state of said semiconductor storage device to said error correcting circuit encode state, to said power-OFF state, and to said centralized refresh state and, until instructions for exiting said ultra-low power consumption are provided, repeats transition from said centralized refresh state to said power-OFF state, from said power-OFF state to said power-ON state, and from said power-ON state to said centralized refresh state.

25. The semiconductor storage device according to claim 21, wherein said controller, in said ultra-low power consumption mode, if said semiconductor storage device is put in said centralized refresh state when instructions for exiting said ultra-low power consumption mode are provided, changes an internal state of said semiconductor storage device to said error correcting circuit decode state and then induces occurrence of transition of an internal state of said semiconductor storage device to a self-refresh state in which said memory cell is refreshed in a period corresponding to a maintaining characteristic of said memory cell.

26. The semiconductor storage device according to claim 21, wherein said controller, in said ultra-low power consumption mode, if said semiconductor storage device is put in said power-OFF state when instructions for exiting said ultra-low power consumption mode are provided, changes an internal state of said semiconductor storage device to said power-ON state and to said error correcting circuit decode state and then induces occurrence of transition of an internal state of said semiconductor storage device to a self-refresh state in which a refresh process is performed on said memory cell in a period corresponding to a maintaining characteristic of said memory cell.

27. The semiconductor storage device according to claim 21, wherein said controller, in said ultra-low power consumption mode, if said semiconductor storage device is put in said error correcting circuit encode state when instructions for exiting said ultra-low power consumption mode are provided and after said error correcting circuit encode state has been terminated, induces occurrence of transition of an internal state of said semiconductor storage device to a self-refresh state in which a refresh process is performed on said memory cell in a period corresponding to a maintaining characteristic of said memory cell.

28. The semiconductor storage device according to claim 20, wherein said controller outputs a state signal indicating that said semiconductor storage device is internally put in said ultra-low power consumption mode.

29. The semiconductor storage device according to claim 20, wherein a self-refresh mode is used such that said memory cell is periodically and automatically refreshed.

30. The semiconductor storage device according to claim 20, wherein said controller has, in said centralized refresh state, said refresh executing unit perform said refresh process in a period being shorter than that corresponding to a maintaining characteristic of said memory cell.

31. The semiconductor storage device according to claim 20, wherein said controller, in said power-OFF state, turns OFF all power sources other than paired poles in said internal power source circuit.

32. The semiconductor storage device according to claim 20, wherein said controller, in said power-OFF state, interrupts a leak path of peripheral circuits of a memory array made up of a plurality of said memory cells.

33. The semiconductor storage device according to claim 20, wherein said controller, when instructions are provided for operations in said ultra-low power consumption mode, changes an internal state of said semiconductor storage device to said centralized refresh state and, until instructions for exiting said ultra-low power consumption mode are provided, repeats transition from said centralized refresh state to said power-OFF state, from said power-OFF state to said power-ON state, and from said power-ON state to said centralized refresh state.

34. The semiconductor storage device according to claim 20, wherein said controller, in said ultra-low power consumption state, if said semiconductor storage device is put in said centralized refresh state when instructions for exiting said ultra-low power consumption state are provided, induces occurrence of transition of an internal state of said semiconductor storage device to a self-refresh state in which a refresh process is performed on said memory cell in a period corresponding to a maintaining characteristic of said memory cell.

35. The semiconductor storage device according to claim 20, wherein said controller, in said ultra-low power consumption mode, if said semiconductor storage device is put in said power-OFF state when instructions for exiting said ultra-low power consumption mode are provided, changes an internal state of said semiconductor storage device to said power-ON state and then induces occurrence of transition to a self-refresh state in which a refresh process is performed on said memory cell in a period corresponding to a maintaining characteristic of said memory cell.

36. The semiconductor storage device according to claim 20, wherein instructions for operations in said ultra-low power consumption mode are provided by a first change occurring in said specified signal and instructions for exiting said ultra-low power consumption mode are provided by a second change occurring in said specified signal.

37. The semiconductor storage device according to claim 36, wherein, after said ultra-low power consumption mode has exited, instructions for transition of an internal state of said semiconductor storage device into an idle state in which no operation is performed are provided by said second change again occurring in said specified signal.

38. The semiconductor storage device according to claim 37, wherein, after said second change has occurred in said specified signal which are used to provide instructions for exiting said ultra-low power consumption mode and when maximum time or more required for error correction in said error correcting circuit decode state has elapsed, said second change is produced in said specified signal to provide instructions for transfer of an internal state of said semiconductor storage device to said idle state.

39. A semiconductor storage device having a memory cell which must be refreshed to maintain data, comprising:
a self-refresh executing means to refresh said memory cell;
an internal power source circuit to provide power to each of components; and
a controlling means, when instructions are provided for operations in an ultra-low power consumption mode in order to exert power control in a standby state, to have said self-refresh executing means execute refresh operations in a centralized refresh state in which a centralized refresh process is performed on said memory cell, an a power-OFF state in which said internal power source circuit is partially turned OFF, and in a power-ON state in which said internal power source circuit having been partially turned OFF is turned ON.

40. The semiconductor storage device according to claim 39, further comprising an error correcting circuit used to perform arithmetic operations on parity bits to restore said memory cell whose maintaining characteristics are deteriorated and to make error corrections based on results from said arithmetic operations and wherein said controlling means executes operations in an error correcting circuit encode state to have said error correcting circuit perform said arithmetic operations and in an error correcting circuit decode state to have said error correcting circuit make said error correction.

41. The semiconductor storage device according to claim 40, wherein said error correcting circuit operates in synchronization with a clock occurring internally or being fed from an external.

42. The semiconductor storage device according to claim 39, wherein said controlling means outputs a state signal indicating that said semiconductor storage device is internally put in said ultra-low power consumption mode.

43. The semiconductor storage device according to claim 39, wherein a self-refresh mode is used such that said memory cell is periodically and automatically refreshed.

44. The semiconductor storage device according to claim 39, wherein said controlling means has, in said centralized refresh state, said refresh executing means perform said refresh process in a period being shorter than that corresponding to a maintaining characteristic of said memory cell.

45. The semiconductor storage device according to claim 39, wherein said controlling means, in said power-OFF state, turns OFF all power sources other than paired poles in said internal power source circuit.

46. The semiconductor storage device according to claim 39, wherein said controlling means, in said power-OFF state, interrupts a leak path of peripheral circuits of a memory array made up of a plurality of said memory cells.

47. The semiconductor storage device according to claim 39, wherein said controlling means, when instructions are provided for operations in said ultra-low power consumption mode, changes an internal state of said semiconductor storage device to said centralized refresh state and, until instructions for exiting said ultra-low power consumption mode are provided, repeats transition from said centralized refresh state to said power-OFF state, from said power-OFF state to said power-ON state, and from said power-ON state to said centralized refresh state.

* * * * *